United States Patent [19]

Ivanov et al.

[11] Patent Number: 5,475,694
[45] Date of Patent: Dec. 12, 1995

[54] FUZZY MULTIPLE SIGNATURE COMPACTION SCHEME FOR BUILT-IN SELF-TESTING OF LARGE SCALE DIGITAL INTEGRATED CIRCUITS

[75] Inventors: André Ivanov, Richmond; Yuejian Wu, Vancouver, both of Canada

[73] Assignee: The University of British Columbia, Vancouver, Canada

[21] Appl. No.: 5,357

[22] Filed: Jan. 19, 1993

[51] Int. Cl.[6] .................................................. H04B 3/46
[52] U.S. Cl. .................... 371/22.4; 371/26; 371/25.1; 371/22.3; 371/27
[58] Field of Search ..................... 371/22.4, 26, 25.1, 371/28, 22.6, 15.1, 22.3, 27; 324/73.1, 537

[56] References Cited

U.S. PATENT DOCUMENTS

| | | | |
|---|---|---|---|
| 4,510,572 | 4/1985 | Reece et al. | 364/489 |
| 4,768,196 | 8/1988 | Jou et al. | 371/22.4 |
| 4,817,093 | 3/1989 | Jacobs et al. | 371/22.4 |
| 4,855,670 | 8/1989 | Green | 371/22.3 |
| 4,864,570 | 9/1989 | Savaglio et al. | 371/22.4 |
| 4,897,842 | 1/1990 | Herz et al. | 371/22.4 |

FOREIGN PATENT DOCUMENTS

| | | |
|---|---|---|
| 303107 | 6/1989 | Germany . |
| 1411750 | 7/1988 | U.S.S.R. . |
| 1566353 | 5/1990 | U.S.S.R. . |

OTHER PUBLICATIONS

Agarwal, V. K. and Zorian, Y., "An Introduction To An Output Data Modification Scheme," in Development In Integrated Circuit Testing, Academic Press Limited, 1987, pp. 219–256.

Bardell, P. H., McAnney, W. H. and Savir, J., Built–In Test for VLSI: Pseudorandom Techniques, John Wiley & Sons, Inc., 1987, pp. 140–145 and 278–313.

Bhavsar, D. K. and Krishnamurthy, B., "Can We Eliminate Fault Escape in Self Testing By Polynomial Division?," Proc. Int. Test Conf., 1985, pp. 134–139.

Bhavsar, D. K., "Concatenable Polydividers: Bit–sliced LFSR Chips for Board Self–Test," Proc. Int. Test Conf., 1985, pp. 88–93.

Breuer, M. A., Gupta, R. and Lien, J., "Concurrent Control of Multiple BIT Structures", Proc. Int. Test Conf., 1988, pp. 431–442.

Gelsinger, P. P., "Built In Self Test of the 80386," Proc. ICCD, 1986, pp. 169–173.

Hassan, S. and McCluskey, E., "Increased Fault Coverage through Multiple Signatures," Proc. FTCS–14, Jun. 1984, pp. 354–359.

IEEE 1149.1 Standard Test Access Port and Boundary–Scan Architecture, IEEE Standards Office, N.J., May 1990, pp. 720–725.

Ivanov, A. and Pilarski, S., "Performance of Signature Analysis: a survey of bounds, exact, and heuristic algorithms," Integration, the VLSI J., 13, 1992, pp. 17–38.

Katoozi, M. and Nordsieck, A., "Built–In Testable Error Detection and Correction," IEEE J. of Solid–State Circuits, vol. 27, No. 1, Jan. 1992, pp. 59–66.

(List continued on next page.)

*Primary Examiner*—Emanuel T. Voeltz
*Assistant Examiner*—Hal D. Wachsman
*Attorney, Agent, or Firm*—Oyen Wiggs Green & Mutala

[57] ABSTRACT

A method of testing a digital integrated circuit for faults. A plurality of n check points $l_1, l_2, \ldots, l_n$ are established to define a test sequence. A set of m references $r_1, r_2, \ldots, r_m$ are predefined, corresponding to the signatures which the circuit would produce at the corresponding check points in the absence of any faults. A test sequence is applied to the circuit and an output signature $s_i$ is derived from the circuit at the corresponding check point $l_i$. The output signature is compared with each member of the set of references. The circuit is declared "good" if the signature matches at least one member of the set of references, or "bad" if a signature matches no members of the set of references. Testing proceeds in similar fashion at the next check point, until the circuit has been tested at all check points.

18 Claims, 10 Drawing Sheets

OTHER PUBLICATIONS

Lambidonis, D., Agarwal, V. K., Ivanov, A. and Xavier, D., "Computation of Exact Fault Coverage for Compact Testing Schemes," Proc. ISCAS, Jun. 1991, pp. 1873–1876.

Lee, Y. H. and Krishna, C. M., "Optimal Scheduling of Signature Analysis for VLSI Testing," Proc. Int. Test Conf., 1988, pp. 443–447.

Mead, C., and Conway, L., Introduction to VLSI Systems, Addison–Wesley Publishing Company, 1980.

Waicukauski, J. A., Gupta, V. P. and Patel, S. T., "Diagnosis of BIST Failures by PPSFP Simulation," Proc. Int. Test Conf., 1987, pp. 480–484.

Wu, Y. and Ivanov, A., "A Multiple Signature Scheme for BIST", Proc. Canadian Conf. on VLSI, 1991, pp. 2.2.1–2.2.7.

Wu, Y. and Ivanov, A., "A Minimal Hardware Overhead BIST Data Compaction Scheme", Proc. Int. Conf. ASIC, Rochester, N.Y., SeP. 1992.

Zorian, Y. and Agarwal, V. K., "Optimizing Error Masking in BIST by Output Data Modification", Journal of Electronic Testing: Theory and Applications, Kluwev Academic Press, 1, 59–71 (1990).

Zorian, Y., "Automated Built–In Self–Test for Embedded Macrocells," Proc. ATE and Instrumentation, Anaheim, Calif., Jan. 1991, pp. 57–62.

Scholz, H. et al., "ASIC Implementations of Boundary–Scan and BIST," Int. Custom Microelectronics Conf., London, UK, Nov. 1988, pp. 43.0–43.9.

Gelsinger, P., Iyengar, S., Krauskopf, J., and Nadir, J., "Computer Aided Design and Built–In Self–Test on the i486TM CPU," Proc. ICCD, Oct. 1989, pp. 199–201.

Wu, Y. and Ivanov, A., "A Multiple Signature Compaction Scheme for BIST," Proc. Canadian Conf. on VLSI, 1991, pp. 2.2.1–2.2.7 (also published in the Microelectronics Journal, vol. 23, 1992, pp. 205–214, Elsevier Science Publishers Ltd.).

Wu, Y. and Ivanov, A., "Minimal Hardware Multiple Signature Analysis for BIST," Proc. 11th IEEE VLSI Test Symp., Apr. 1993, pp. 17–20.

Wu, Y. and Ivanov, A., "A Fuzzy Multiple Signature Compaction Scheme for BIST," Proc. 1st Asian Test Symp., Nov. 1992, Japan, pp. 247–252.

Keller, B., Carlson, D., and Maloney, W., "The Compiled Logic Simulator," IEEE J. of Design & Test, Mar. 1991, pp. 21–34.

Keller, B. L. and Snethen, T. J., "Built–in Self–test Support in the IBM Engineering Design System," IBM J. Res. & Develop., vol. 34, No. 2/3, Mar./May 1990, pp. 406–415.

Kuban, J. R. and Bruce, W. C., "Self–Testing the Motorola MC6804P2," IEEE J. of Design & Test, May, 1984, pp. 33–41.

Li, Y. K. and Robinson, J. P., "Space Compression Methods with Output Data Modification," IEEE Trans. on CAD, vol. CAD–6, No. 2, Mar. 1987, pp. 290–294.

McAnney, W. and Savir, J., "Built–In Checking of the Correct Self–Test Signature," Proc. Int. Test Conf., 1986, pp. 54–58.

Pomeranz, I., Reddy, S. M. and Tangirala, R., "On Achieving Zero Aliasing for Modeled Faults," Proc. European Design Auto. Conf., 1992.

Agarwal, V. K., "Increasing Effectiveness of Built–In Self–Test by Output Data–Modification," Proc. IEEE 14th Symp. on Fault–Tolerant Computing, 1983, pp. 227–234.

Robinson, J. P. and Saxena, N. R., "Simultaneous Signature and Syndrome Compression," IEEE trans. CAD., May 1988, pp. 584–589.

Youn, H. Y., "Compact Testing with Intermediate Signature Analysis," Proc. 1991 IEEE VLSI Test Symposium, Apr. 1991.

Aitken, R. C. and Agarwal, V. K., "Aliasing Probability of Non–Exhaustive Randomized Syndrome Tests," Proc. Intl. Conf. CAD., 1988.

Gupta, S. K., Pradhan, D. K. and Reddy, S. M., "Zero Aliasing Compression," Proc. IEEE 20th Symp. on Fault–Tolerant Computing, 1990, pp. 254–263.

Yih, J. and Mazumder, P., "Circuit Behavior Modeling and Compact Testing Performance Evaluation," IEEE J. of Solid–State Circuits, vol. 26, No. 1, Jan. 1991, pp. 62–66.

FUZZY MULTIPLE SIGNATURE COMPACTION SCHEME FOR BUILT-IN SELF-TESTING OF LARGE SCALE DIGITAL INTEGRATED CIRCUITS

FIELD OF THE INVENTION

This application pertains to the testing of large scale digital integrated circuits for detection of circuit faults. A "fuzzy" multiple signature analysis approach eliminates the need for strict one-to-one correspondence between each signature obtained from the circuit under test and a reference signature. Signatures obtained from the circuit under test need only correspond to any one of a set of reference signatures.

BACKGROUND OF THE INVENTION

Built-In Self-Test ("BIST") is an increasingly popular means of testing large scale digital integrated circuits ("ICs") for circuit faults. A test pattern is generated on the IC to be tested; and, output data obtained by subjecting the IC to the test pattern is evaluated on the IC itself. The output data evaluation generally consists of (i) data compaction, whereby the output sequences produced by the circuit under test ("CUT") are compacted into a single signature of a few bits, and (ii) comparison of the signature with a predetermined fault-free signature to determine whether the CUT is good. However, due to the information loss through data compaction, some error responses may be mapped to the fault-free signature, thus causing some faulty circuits to escape detection. This problem is called aliasing. Usually, fault coverage before compaction can be detected by fault simulation. But, fault coverage after data compaction can usually only be estimated since exact fault simulation is not computationally feasible for large circuits. Although many probabilistic techniques have been developed, they can not be used with confidence for a specific CUT because of statistical uncertainties.

At least two kinds of signature analysis have been proposed: single signature ("SS") analysis and multiple signature ("MS") analysis (see: Bardell, P. H., McAnney, W. H. and Savir, J., "Built-In Test for VLSI: Pseudorandom Techniques", John Wiley & Sons, Inc., 1987). In the SS scheme, only a single final signature is checked at the end of a test session. In the MS scheme, however, in addition to the final signature, some intermediate signatures are checked as well. The MS scheme is known to significantly reduce aliasing. Recently, it has been shown that, besides reducing aliasing, checking multiple signatures has many other advantages over the SS scheme. For example, by checking multiple signatures, exact fault coverage after data compaction can be easily computed for large CUTs by fault simulation. Average test time can be greatly reduced by checking multiple signatures since a faulty CUT's testing session can be terminated as soon as any incorrect intermediate signature is detected. Fault diagnosability also improves with multiple signatures.

A major problem with MS schemes is that they require complex implementation and large associated hardware overhead. In "A Multiple Signature Scheme for BIST", Proc. Cdn. Conf. on VLSI 1991, the present inventors proposed a multiple signature compaction scheme for BIST. By sharing some of the circuitry required by standard single signature BIST schemes, the scheme achieves very small aliasing at the expense of small silicon area. Unfortunately, the scheme's silicon area requirements increase with test length. This makes the scheme less attractive as CUTs get larger and require long test sets. The present invention provides a new output data compaction scheme for BIST which is simple to implement and requires little hardware overhead, even compared with SS schemes, and yet has all the advantages of conventional MS schemes.

SUMMARY OF THE INVENTION

In accordance with the preferred embodiment, the invention provides a method of testing a digital integrated circuit for faults. A plurality of n check points $l_1, l_2, \ldots i_n$ are established at specific points within the test output sequence. A set of m references $r_1, r_2, \ldots, r_m$ are predefined. This set of m references includes at least all of the signatures which the circuit would produce at the corresponding check points in the absence of any fault or faults. A test sequence is applied to the circuit and an output signature si is derived from the circuit at the corresponding check point $l_i$. The output signature is compared with each member of the set of references. If the signature does not match any member of the set of references, the circuit is declared "bad" and testing may be terminated. If the signature matches any member of the reference set, testing proceeds in similar fashion to the next check point. The circuit may be declared "good" if the signature corresponding to each of the pre-defined check points matches at least one member of the reference set.

DETAILED DESCRIPTION OF THE PREFERRED EMBODIMENT 1.0 Conventional Signature Analysis
1.1 Single Signature Schemes In BIST with signature analysis, to compact an output sequence, the sequence is shifted bit by bit into a signature analyzer implemented by a linear feedback shift register ("LFSR"). At the end of the test session, the contents of the LFSR form the signature. Denoting the output sequence length by l and the number of the LFSR stages by k, under the assumption of the equally likely error model of Bardell et al (supra) the aliasing probability $P_{al}$ is:

$$P_{al} = \frac{2^{l-k} - 1}{s^l - 1} \quad (1)$$

Assuming l>>k yields $P_{al} \approx 2^{-k}$. This asymptotic result is well-known, and is also true for unequally likely error models.

1.2 Multiple Signature Schemes

Assuming the equally likely error model, it has been shown that if two signatures are checked, i.e., an intermediate signature after the first $l_1$ bits of the sequence have been shifted into the signature analyzer, and a second signature at the end of the sequence of length l, then the aliasing probability is:

$$P_{al}(2) = \left( \frac{2^{l_1-k} - 1}{2^{l_1} - 1} \right) \left( \frac{2^{l-k} - 1}{2^l - 1} \right) \quad (2)$$

Assuming l>>k yields $P_{al}(2) \approx 2^{-2k}$. It is easy to prove that $P_{al}(n) \approx 2^{-nk}$ if n signatures are checked at positions $l_1, l_2, \ldots, l_n$, respectively, and assuming $k \ll l_1 < l_2 < \ldots < l_n = l$, where $l_i$ is the position of the ith signature. These positions are called "check points". Assume the n signatures generated by the LFSR at the check points $l_1, l_2, \ldots, l_n$ are $s_1, s_2, \ldots, s_n$, i.e., the ith signature $s_i$ is checked after $l_i$ bits of the sequence have been shifted into the LFSR. Once the check points are fixed, by logic simulation, one can easily determine the n corresponding fault-free signatures or references, $r_1, r_2, \ldots, r_n$. When testing the CUT, the ith signature $s_i$ is compared with its corresponding reference $r_i$ at the ith check point. Thus, in this prior art scheme, the signatures and references must correspond on a one-to-one basis for a CUT to be declared good. Such a one-to-one correspondence between specific references and signatures at specific check points makes conventional multiple signature ("CMS") schemes complicated and expensive to implement.

Figure 1:
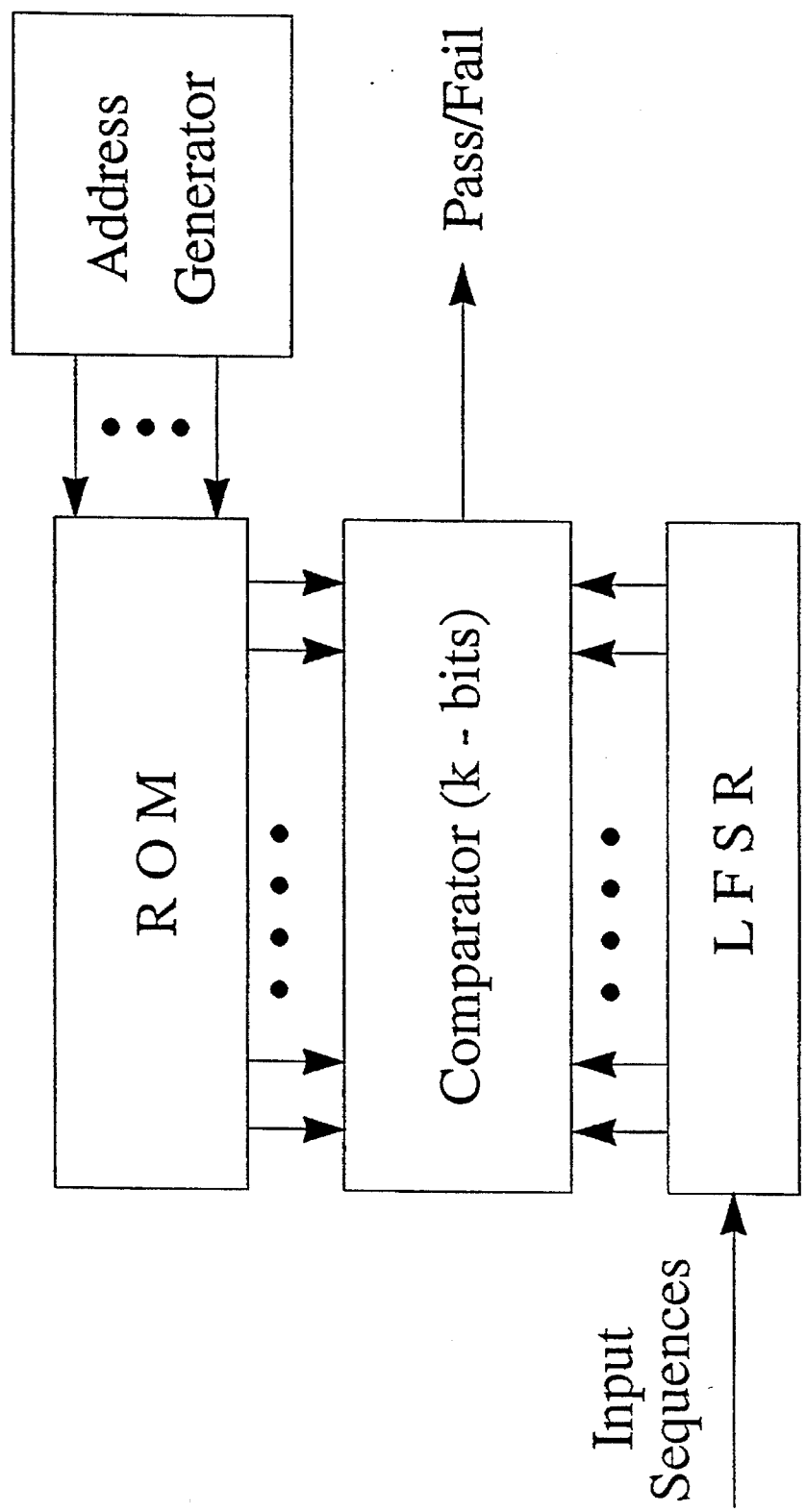
FIG. 1 is a block diagram representation of a conventional prior art multiple signature compaction scheme having a parallel comparator.

FIG. 1 illustrates an implementation of such a prior art CMS scheme. As shown, in addition to a read only memory ("ROM") for storing the n references, extra circuitry is required for generating ROM addresses and comparing ROM output with the signatures from the LFSR. Usually, such extra circuitry requires more silicon area than the ROM itself. This is because implementing the address generator requires a form of counter, which is area-consuming compared to combinational circuits and ROM cells. Also, comparing the references with the signatures requires either a parallel comparator or a serial comparator with some kind of parallel to serial converter to convert each k-bit reference into a serial k-bit sequence. A parallel comparator or a parallel to serial converter also takes considerable silicon area if k is not very small. Furthermore, connections among these functional blocks can also take much area.

2.0 Fuzzy Multiple Signature Analysis

As mentioned above, the complexity of checking multiple signatures is mainly due to the need for one-to-one correspondence between the references and signatures. Removal of this strict requirement significantly simplifies the data compactor. This essential concept, which underlies the present invention, is referred to as a Fuzzy Multiple Signature ("FMS") scheme since it consists of checking multiple signatures, without requiring one-to-one correspondence between each reference and signature.

2.1 Basis

Like the CMS scheme, the FMS scheme also checks n signatures at check points, $l_1, l_2, \ldots, l_n$. But, unlike the CMS scheme where a signature $s_i$ is compared with a specific reference $r_i$ at check point $l_i$, in the FMS scheme, each signature $s_i$ is compared with the whole set of references $r_1, r_2, \ldots, r_n$. A signature $s_i$ is considered good if it matches any of the references in the reference set. Therefore, in the FMS scheme, for a CUT to be declared good, it suffices that the signature obtained from the LFSR at each check points corresponds to any of the references $r_1, r_2, \ldots, r_n$. Thus, in the FMS scheme, the requirement for the one-to-one reference-to-signature correspondence is removed. This "fuzziness" introduced by allowing a multiple reference-to-signature correspondence may result in a small increase in aliasing compared to the CMS scheme for given k and n. But, this can be easily compensated for by the reduced complexity of the FMS scheme compared to the CMS scheme. Otherwise, the FMS scheme has all the advantages that the CMS scheme has over SS schemes.

2.2 Implementation

Figure 2:
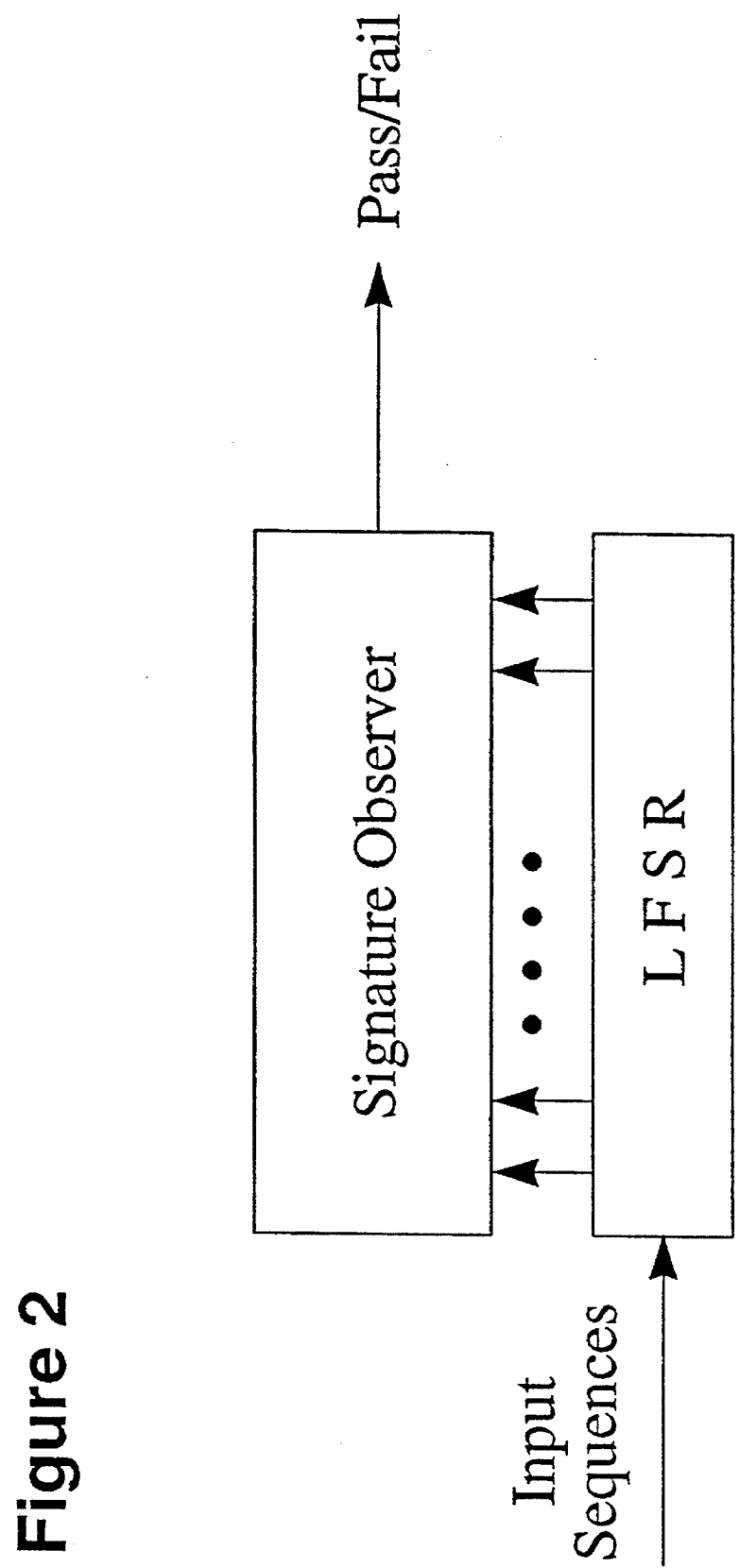
FIG. 2 is a block diagram representation of a multiple signature data compaction scheme in accordance with the present invention.

Since one-to-one correspondence between references and signatures is unecessary, implementing the FMS scheme is very simple. As shown in FIG. 2, the FMS scheme requires a Signature Observer ("SO") and a LFSR. The LFSR collects signatures. The SO checks each signature, and generates Pass/Fail signals. At each check point, if the signature generated by the LFSR matches any of the references, the SO outputs a Pass signal, say logic 0. Otherwise, the SO outputs a Fail signal, say logic 1. The Fail signal can be fed to a test controller to terminate the testing and declare the CUT as faulty. If the SO outputs Pass signals at all of the predetermined check points, the CUT is declared good. The SO is a k-input, 1-output combinational circuit which outputs a 0 when its input vector belongs to the reference set, and outputs a 1 otherwise.

EXAMPLE 1

Assume n=k=3, i.e., to check three 3-bit signatures. If the references are $r_1=111$, $r_2=110$, and $r_3=100$, denoting the three bits of the references by $b_1$, $b_2$, and $b_3$, respectively, the function of the SO can be described as:

$$Pass/Fail = \overline{b_1 b_2 b_3 + b_1 b_2 \bar{b}_3 + b_1 \bar{b}_2 \bar{b}_3} = \overline{b_1 b_2 + b_1 \bar{b}_3} = \overline{b_1} \overline{b_2 b_3} \quad (3)$$

Figure 3:
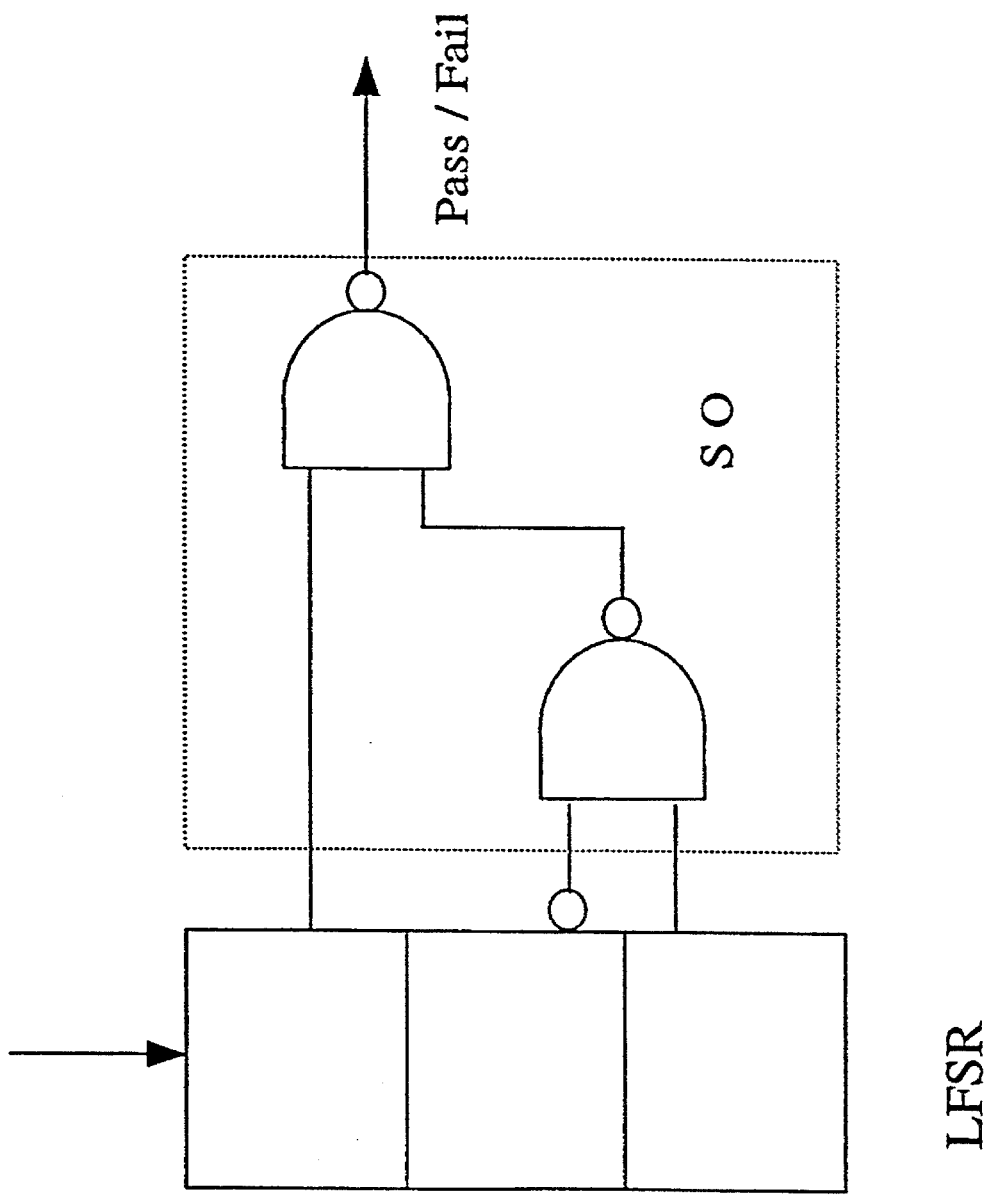
FIG. 3 depicts a three bit signature observer for use with references 111, 110 and 100.

Thus, the SO can be implemented with two 2-input NAND gates as shown in FIG. 3.

In general, to check n k-bit signatures, the SO can be easily implemented with a k-input, 1-output, m-cube programmable logic array ("PLA"), or other non-PLA-type logic structures. However, logic minimization can be used to reduce the area of the SO, as illustrated in Example 1. Furthermore, the number of references m that need to be included in the set of references can be reduced using the techniques described below, thereby reducing the hardware requirements of the SO.

2.3 FMS Aliasing Performance Analysis

Assume the compaction of a l-bit random sequence into a k-bit signature, and $r_1$ to be the only valid reference. The total number of sequences (including the fault-free one) that map to $r_1$ is $2^{l-k}$. If it is assumed that distinct references $r_1$ and $r_2$ are both acceptable, then the total number of sequences that map to either $r_1$ or $r_2$ is $2 \times 2^{l-k}$ since the sequences that map to one will not map to the other. Thus, assuming that m distinct references, $r_1, r_2, \ldots, r_m$ are acceptable, the total number of l-bit sequences that map to any one of the m references is $m \times 2^{l-k}$. Excluding the fault-free sequence, the number of aliased error sequences for such case is thus $m \times 2^{l-k} - 1$. Since there are $2^l - 1$ possible error sequences, assuming all are equally likely, the aliasing probability when m distinct references are acceptable at a single check point is:

$$P_{al} = \frac{m2^{l-k} - 1}{2^l - 1} \quad (4)$$

Assuming $l \gg k$ yields $P_{al} \approx m2^{-k}$.

The FMS scheme checks n signatures at check points $l_1, l_2, \ldots, l_n$ against a set of m references, with $m \leq n$ because there can be at most n distinct references if n signatures are checked. However, some references may happen to be, or be made identical, thus making $m < n$. Using the arguments presented above in Section 1.2 for the aliasing probability of CMS schemes, the following aliasing probability results for the FMS scheme:

$$P_{FMS} = \left( \frac{m2^{l_i-k} - 1}{2^{l_i} - 1} \right)^n \quad (5)$$

where $l_i$ is the ith check point.

Assuming $l_i \gg k$ yields:

$$P_{FMS} \approx [m2^{-k}]^n \quad (6)$$

Clearly, for fixed k and n, the best-case aliasing occurs for $m=1$. The worst case aliasing occurs when $m=n$, for which $P_{FMS} \approx [n2^{-k}]^n$.

The following analysis assumes the worst-case scenario (i.e., $m=n$). To study the aliasing performance of the FMS scheme a "FMS scheme equivalent length" $L_e^{FMS}$ is defined as a figure of merit. For a given aliasing probability in the FMS scheme, define $L_e^{FMS}$ to be the length of a LFSR that yields the same aliasing probability in a SS scheme. Ideally, $L_e^{FMS}$ should be as large as possible to minimize aliasing. Assume $L_e^{FMS}$ to be a continuous variable. Since $P_{SS} \approx 2^{-k}$ and $P_{FMS} \approx [n2^{-k}]^n$, then $$2^{-L_e^{FMS}} \approx [n2^{-k}]^n \quad (7)$$

Solving for $L_e^{FMS}$ yields:

$$L_e^{FMS} = n(k - \log_2(n)) \quad (8)$$

In comparison, the equivalent length of a CMS scheme is $L_e^{CMS} = nk$; while that of a SS scheme is $L_e^{SS} = k$. Thus, $L_e^{FMS} = L_e^{CMS} - n\log_2(n)$ for given n and k.

EXAMPLE 2

Assuming $k=16$ and $n=4$, $L_e^{SS}=16$, $L_e^{CMS}=64$, and $L_e^{FMS}=64-4\times2=56$. Thus, $P_{CMS}=2^{-64}$, $P_{FMS}=2^{-56}$, and $P_{SS}=2^{-16}$. Here, the aliasing probability of the FMS scheme is 2 orders of magnitude greater than that of the CMS scheme, but still 12 orders of magnitude smaller than that of the SS scheme.

Figure 4:
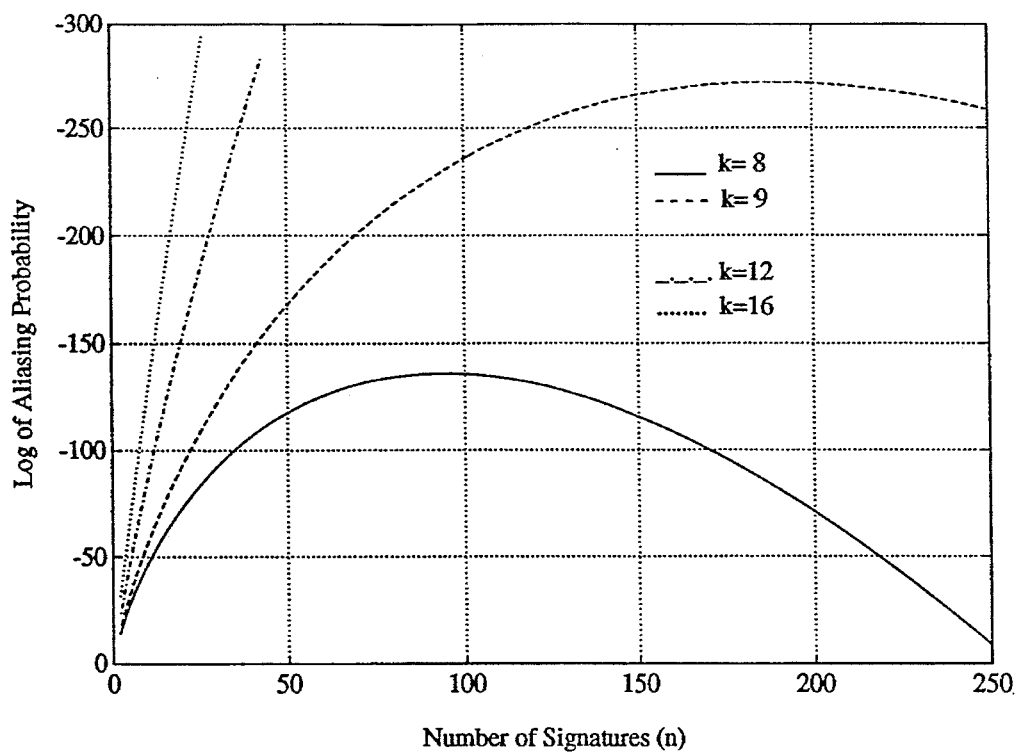
FIG. 4 is a graph illustrating the aliasing performance of the invention.

With the CMS scheme, the equivalent length increases linearly with both k and n. With the FMS scheme, however, the equivalent length increases linearly with k but not with n. For fixed k, as n increases, $L_e^{FMS}$ peaks and then decreases. When $n=2^k$, $L_e^{FMS}=0$. FIG. 4 shows an example of the $L_e^{FMS}$ as a function of n for $k=8, k=9, k=12$ and $k=16$.

3.0 Comparative Evaluation of the FMS Scheme

The aliasing performance and hardware requirements of the FMS scheme will now be compared with those of the SS and CMS schemes, respectively. The worst case of the FMS scheme, i.e., $m=n$ is again considered, and no logic minimization is performed for the SO's function.

3.1 FMS vs. SS

To achieve an aliasing probability of $2^{-k}$, the SS scheme requires a k-bit LFSR. To achieve the same aliasing probability, the FMS scheme only requires a $(k/n + \log 2(n))$ bit LFSR plus the silicon area for the signature observer. For the following more detailed area comparisons, a PLA implementation of the SO is assumed. Since each PLA input variable corresponds to two lines in the AND plane of a PLA, and since the drivers in the PLA take an area of about 8 cubes, the normalized area of a k-input, s-output, n-cube PLA is $(n+8) \times (k \times 2 + s)$ units. Area estimate comparisons are based on the actual layout of a PLA and a 16-bit LFSR, using the Cadence™ automatic place and route tool, and 3 um double-metal CMOS technology. The LFSR was built with static standard cell D flip-flops, and measured about $1.38 \times 10^6$ um². Actual layout revealed that a 12-input, 4-output, 64-cube PLA takes about the same area as a 16-bit LFSR. According to the above analysis, this PLA requires an area of $(64+8) \times (12 \times 2 + 4) = 2016$ units. Therefore, it is assumed that a PLA of 2016 units corresponds to the area of a 16-bit LFSR. The following example illustrates the comparison of the FMS and SS schemes.

EXAMPLE 3

Figure 5:
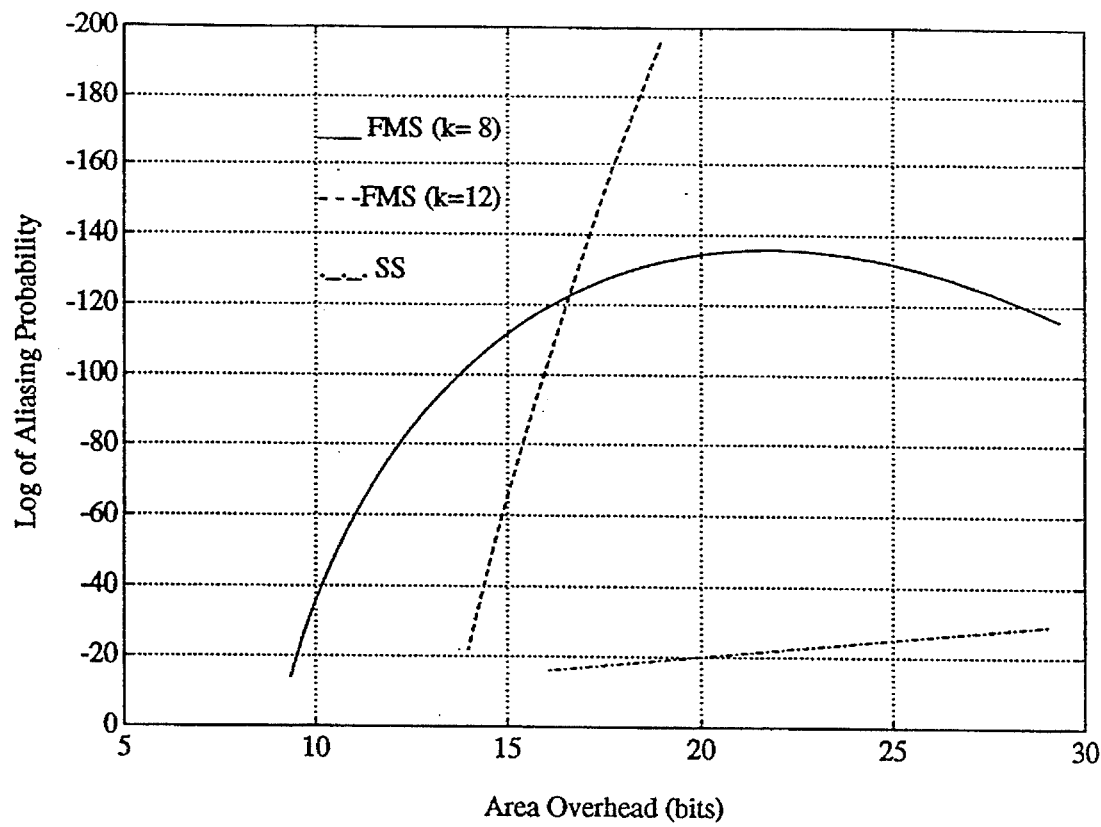
FIG. 5 is a graphical comparison of the silicon area overhead requirements of a multiple signature data compaction scheme in accordance with the present invention with those of conventional single and multiple signature schemes.

If $k=9$ and $n=32$, $P_{FMS}=[32 \times 2^{-9}]^{32}=2^{-128}$. In this case, the required hardware is a 9-stage LFSR, and a 9-input, 1-output, 32-cube PLA to implement the SO. The PLA requires $(32+8) \times (9 \times 2 + 1) = 760$ units of area, which is about 37.7% of the size of a 16-bit LFSR, or about the size of a 6-bit LFSR. Thus, the total area overhead for the FMS scheme to achieve $P_{FMS}=2^{-128}$ is approximately the area of a $6+9=15$ bit LFSR. In comparison, a SS scheme would require a 128-bit LFSR to achieve $P_{SS}=2^{-128}$. More examples are summarized in FIG. 5, where the area for achieving a given aliasing probability is given in terms of equivalent LFSR sizes. As shown in FIG. 5, with the FMS scheme, small aliasing can be obtained against very small hardware overhead compared to what is required in the case of a SS scheme.

3.2 FMS VS. CMS

To simplify the comparison of the FMS and CMS schemes, for the CMS scheme assume a PLA is used to implement the ROM and comparator functions while the address generator is implemented using a $\log_2 n$-bit counter if n signatures are checked. To check n k-bit signatures with the CMS scheme, the PLA has $k + \log_2 n$ inputs, 1 output and n cubes. The PLA's inputs are the k-bit signature from the LFSR (as in the FMS scheme) and a $\log_2 n$-bit index from the counter. Here, one need only measure the area overhead beyond that required by a SS scheme (in other words, the area of the LFSR is not measured, since it is the same for both the FMS and CMS schemes). Thus, the area overhead of the CMS scheme consists of the PLA and the counter. For the FMS scheme, the area overhead is simply a k-input, 1-output, n-cube PLA that implements the SO if n k-bit signatures are checked. The area overhead of the FMS and CMS schemes will now be compared, given a desired aliasing probability.

From the analysis in Section 2.2, for a given signature length k, checking n signatures in the FMS scheme achieves the same aliasing probability $P_{al}$ as checking $n - n/k\log_2 n$ signatures in the CMS scheme. Thus, given k and a desired $P_{al}$, the number of signatures required can be determined for the FMS and CMS schemes respectively. Then, using a calculation similar to that used in Section 3.1, the area required for the FMS and CMS schemes, respectively can be determined.

Figure 6:
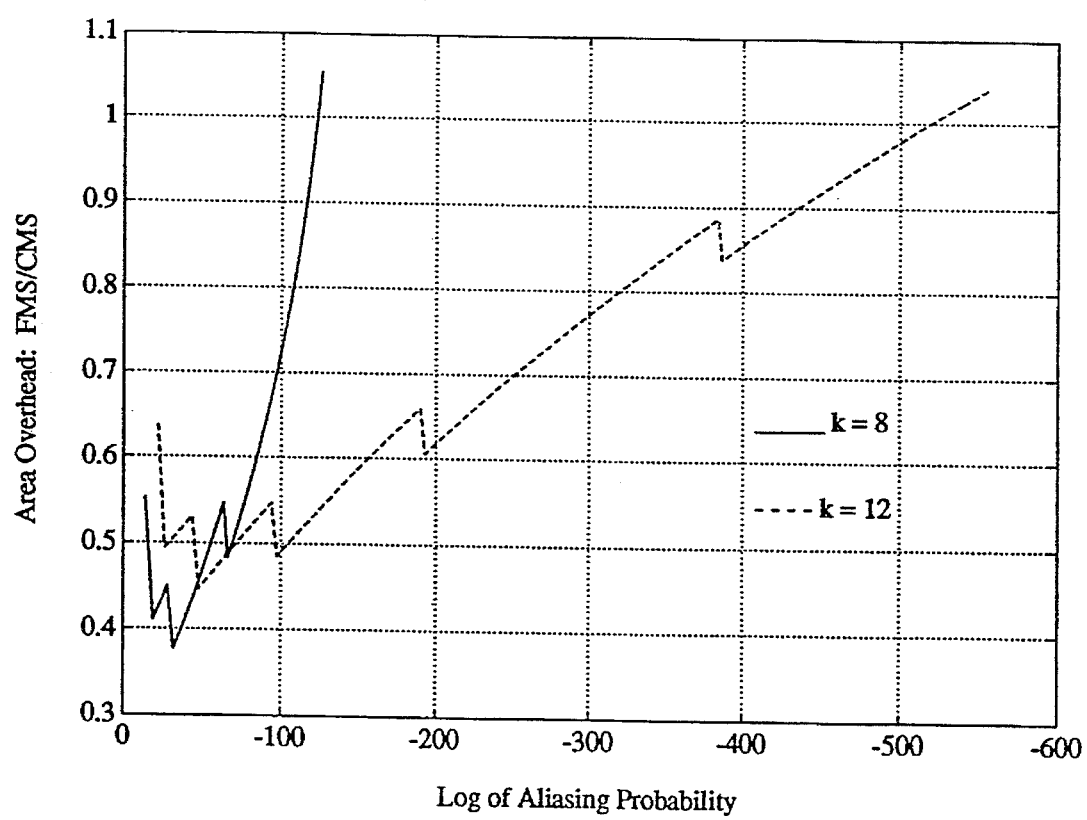
FIG. 6 is a graphical comparison of the silicon area overhead requirements of a multiple signature data compaction scheme in accordance with the present invention with those of a conventional multiple signature scheme.

FIG. 6 illustrates the area overhead of the FMS and CMS schemes for k=8 and k=12. In FIG. 6, the area overhead is given in terms of equivalent LFSR sizes. From FIG. 6, when k=8, the FMS scheme requires less area overhead, compared to the CMS scheme, as $P_{al}>2^{-120}$. When k=12, and for $P_{al}$ greater than $2^{-500}$ approximately, the FMS scheme requires less area overhead than the CMS scheme. If k=16, for $P_{al}$ greater than about $2^{-1000}$ approximately, the FMS scheme requires less overhead also. For a fixed k, when $P_{al}$ is smaller than a certain value, the area overhead of the FMS scheme becomes higher. This is because the aliasing probability of the FMS scheme is not a linear function of n when k is fixed (see FIG. 4).

4.0 Observation and Control
4.1 Test Result Observation

Figure 7:
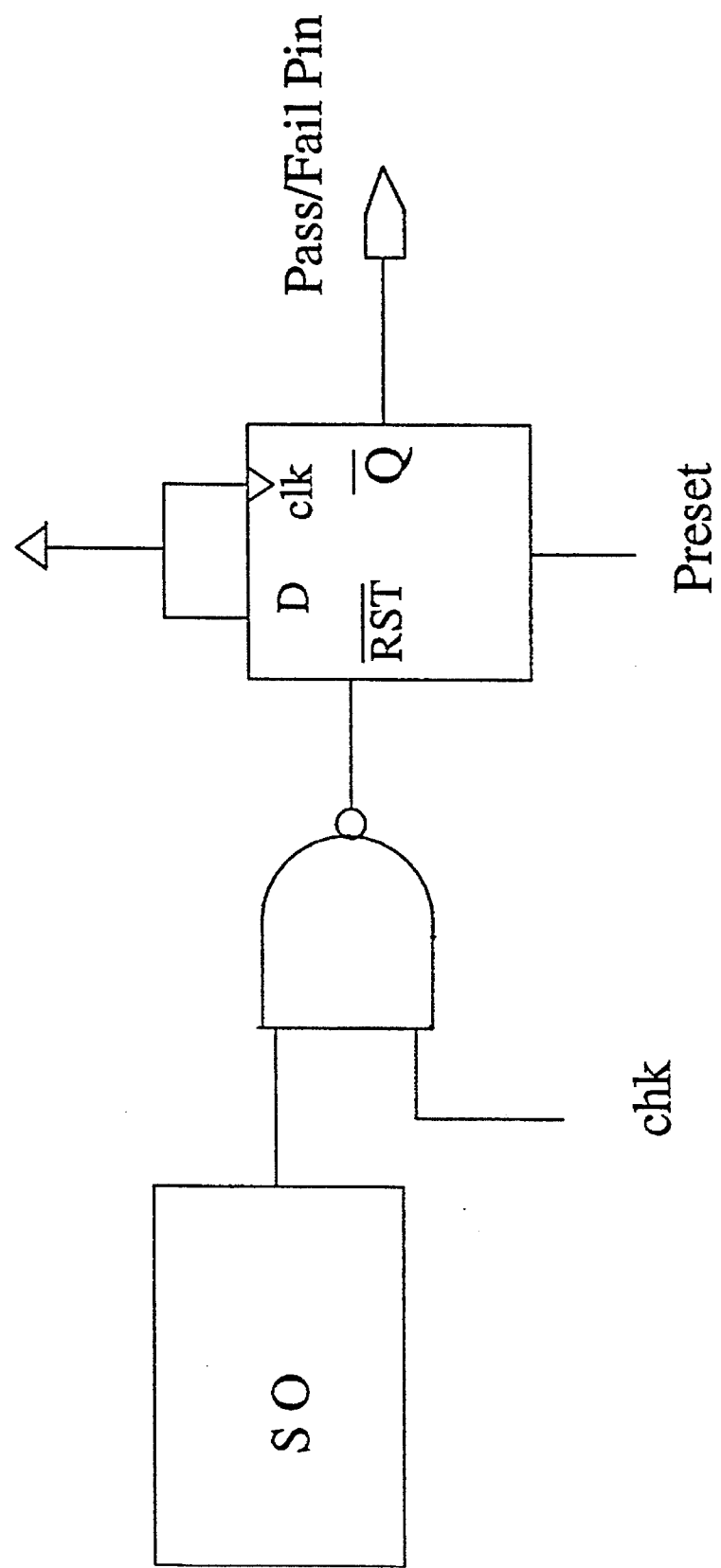
FIG. 7 is a schematic diagram of a detector circuit for detecting a Pass/Fail signal produced by a signature observer.

Two different cases are considered for observation of the test results. First, if there is a Pass/Fail pin available, a "zero" detector may be used, as shown in FIG. 7, to detect the Pass/Fail signal output by the SO. Prior to testing a CUT, the "zero" detector is preset to "1", thus setting the Pass/Fail pin to 0. When a signature is checked, the controller temporarily sets the chk signal to 1. This sensitizes the "zero" detector to the SO output. Once a Fail signal (a "1" at the SO output) is detected, the detector outputs and keeps a Fail signal, "1", at the Pass/Fail pin. The "zero" detector can be shared by all self-testable blocks on an IC chip. When shared, the detector outputs and keeps a Fail signal if any of the self-testable blocks is found faulty. This Fail signal can be used to terminate testing, thereby reducing test time.

In the second case, where a specific protocol for control and observation of BIST is available (see, for example, Scholz, H. et al., "ASIC Implementations of Boundary-Scan and BIST," Int. Custom Microelectronics Conf., London, UK, Nov. 1988, pp. 43.0–43.9) the test result of each self-testable block may consist of a single-bit flag stored in a status register. Once a faulty signature from a self-testable block is detected, the flag for the block is set. The status can be accessed through the IEEE 1149.1 Test Access Port. In this case, the flag can be used as the "zero" detector discussed above for the first case.

4.2 Control Implementation

The controller required for the FMS scheme is the same as for the CMS scheme. It will be shown that the hardware overhead of the FMS scheme's controller can be made as small as that required for the control of a SS scheme. For the control of a SS scheme, an on-chip counter or LFSR (which may be simultaneously used for pseudo random pattern generation) is required to count the applied test vectors. When the final count is reached, a decoder detects this final count and generates a signal to stop the test and perform final signature evaluation.

For the control of the FMS scheme, three possible cases are considered, depending on the scheduling of the check points. In the first case, the check points are arbitrary, i.e., the test length between check points $l_i$ and $l_{i+1}$ can be arbitrarily selected. To control the FMS scheme, like the SS scheme, an on-chip counter is required to count the applied test vectors. When a check point is reached, a decoder detects the corresponding count and outputs a chk signal to enable the evaluation of a signature. Unlike a SS scheme's controller where the decoder detects only the final count, the decoder in this case must decode all the counts corresponding to the check points, and is thus considerably larger. This is the worst case in terms of hardware overhead among the possible implementations of the FMS scheme's controller.

In the second case, the scheduling of the check points follows a regular equidistant pattern, i.e., the test length between $l_i$ and $l_{i+1}$ is constant for all i. A convenient constant is $2^q$, where q is an integer. To control the FMS scheme in this case, the counter required in the SS scheme is simply split into two smaller ones, say $C_1$ and $C_2$. $C_1$ is a q-bit counter which counts the test length between two adjacent check points i.e., $2^q$. $C_2$ counts the number of signatures to be checked. Assume the final count to be 0 for both $C_1$ and $C_2$. Every time $C_1$ decrements to 0, a decoder decodes the 0 and generates the chk signal to enable the evaluation of a signature. If the signature is incorrect testing can be terminated and the CUT declared faulty. Otherwise, $C_2$ is decremented by 1, and testing continues. When both $C_1$ and $C_2$ reach the 0 state, the test is complete. The hardware requirement of the controller in this case is almost the same as that for the SS scheme since the total length of $C_1$ and $C_2$ is the same as that of the counter used in the SS scheme, and the total complexity of the two decoders to decode the 0's from $C_1$ and $C_2$ is the same as that of the decoder in the SS scheme. This is the best case in terms of hardware overhead among the possible implementations of the FMS scheme's controller.

The third case lies between the first two, i.e., the check points are selected such that the test length between two adjacent check points, $l_i$ and $l_{i+1}$, is variable but constrained to values of $2^{q_i}$, where $q_i$ is an integer. In this case, counters $C_1$ and $C_2$ can again be used to count the applied test vectors. $C_1$ must be of length $q_s$, where $q_s = \min q_i$. Two decoders are required. One decodes the 0 state from $C_1$, while the other decodes the counts of $2^{q_i-q_s}$ from $C_2$, i=1, ..., n−1. Every time $C_1$ reaches 0, and $C_2$ reaches $2^{q_i-q_s}$, i ∈ (1, ..., n−1), a signature is checked. The hardware overhead in this case is between that of the first two cases, since the decoder for $C_1$ detects only one count, but the decoder for $C_2$ has to detect n counts corresponding to the check points.

The foregoing assumes a counter for controlling the FMS scheme. A LFSR random pattern generator can be shared as a counter to count the applied test vectors, e.g., as in the BIST controller of the Intel 80386 (see: Gelsinger, P. P, "Built In Self Test of the 80386," Proc. ICCD, 1986, pp. 169–173). The FMS control implementation described above applies equally well to the case where the conventional counter is replaced by a LFSR-type counter. The split of the LFSR into two smaller LFSR-based counters, $C_1$ and $C_2$, will not affect the randomness of the input pattern generator if concatenable polynomials are used (see: Bhavsar, D. K., "Concatenable Polydividers: Bit-sliced LFSR Chips for Board Self-Test," Proc. Int. Test Conf., 1985, pp. 88–93).

5.0 Fault Simulation Experiments

Figure 8:
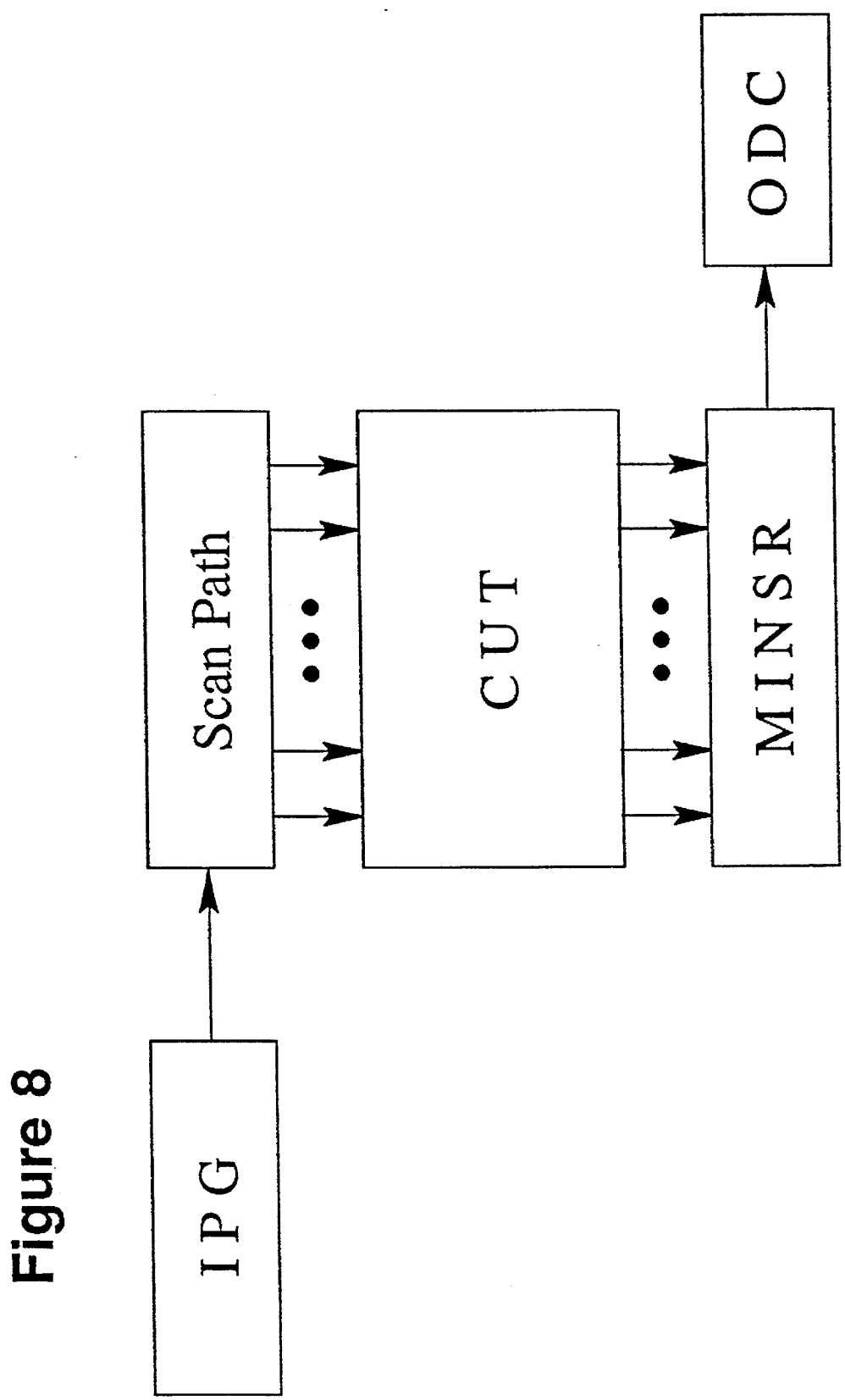
FIG. 8 is a block diagram of a hardware model used to study the fault coverage performance of a multiple signature data compaction scheme in accordance with the present invention.

To study the fault coverage performance of the FMS scheme, exact fault simulation of the ISCAS'85 benchmark circuits (see: Brglez, F. and Fujiwara, H., "A Neutral Netlist of 10 Combinational Benchmark Circuits and a Target Translator in FORTRAN," Proc. IEEE Int. Symp. Circuits and Systems, 1985, pp. 151–158) were performed with output data compaction. FIG. 8 depicts the hardware model used, where "IPG" is an input pattern generator implemented with a LFSR, "ODC" is a output data compactor, and "MINSR" is a multiple input nonfeedback shift register that performs space compaction. Single stuck-at faults were assumed. In the case of the SS scheme, an 8-bit primitive LFSR was used as the data compactor. For the FMS scheme, 8 signatures were checked at equidistant check points, and each was generated by the 8-bit LFSR, i.e., k=8 and n=8. In terms of fault simulation time reduction, the equidistant check point scheduling is the worst of the control strategies described in Section 4.2. But the area requirement for the control of the FMS scheme in this case is the same as that required for a SS scheme. The corresponding hardware overhead in addition to that required for the SS scheme is about the size of a 2.16-bit LFSR. The total silicon area of the FMS scheme in the experiments is thus about equivalent to that of a 10.16-bit LFSR, as opposed to an 8-bit LFSR for the SS scheme.

Table 1 shows the exact fault coverage before signature analysis (the "NC" column), and the coverage with the SS and the FMS schemes, respectively for a test length of 1,024 random vectors. In all cases, the coverage of the FMS scheme is either the same or very close to that of the no-compaction case, and higher than that of the SS scheme.

TABLE 1

| Circuit Name | No. Fault | Fault-Coverage (%) | | |
|---|---|---|---|---|
| | | NC | FMS | SS |
| C432 | 562 | 99.24 | 99.244 | 99.11 |
| C499 | 732 | 98.90 | 98.907 | 97.95 |
| C880 | 1171 | 95.64 | 95.645 | 95.38 |
| C1355 | 1820 | 98.64 | 98.640 | 98.13 |
| C1908 | 2015 | 94.65 | 94.615 | 93.69 |
| C2670 | 2781 | 82.65 | 82.659 | 82.05 |
| C3540 | 4035 | 93.45 | 93.451 | 93.33 |
| C5315 | 5982 | 96.23 | 96.230 | 96.17 |
| C7552 | 8408 | 93.01 | 93.010 | n/a |

Table 2 shows the CPU time required to perform the above fault simulations. From Table 2, the CPU time required to perform the fault simulations with the FMS scheme is always close to that of the no-compaction case, which constitutes a lower bound (see: Lambidonis, D., Agarwal, V. K., Ivanov, A. and Xavier, D., "Computation of Exact Fault Coverage for Compact Testing Schemes," Proc. ISCAS, June 1991, pp. 1873–1876). In the case of the SS scheme, however, the fault simulation time is always one order of magnitude longer. In Table 2, the column "Time Savings" shows the CPU time saved from using the FMS scheme rather than the SS scheme. Here, the number of test vectors simulated is small, and the check point scheduling is the worst case in reducing fault simulation time. If longer test length, larger circuits, and optimal scheduling of the check points were considered, the fault simulation time saved from using the FMS scheme rather than a SS scheme would be even much more significant.

TABLE 2

| Circuit Name | No of Faults | Fault Simulation Time | | | Time Sav |
|---|---|---|---|---|---|
| | | NC | FMS | SS | |
| C432 | 562 | 2.25 | 6.96 | 48.90 | 85.77% |
| C499 | 732 | 3.70 | 11.32 | 72.64 | 84.42% |
| C880 | 1171 | 14.30 | 34.26 | 191.37 | 82.10% |
| C1355 | 1820 | 29.39 | 64.54 | 380.36 | 83.03% |
| C1908 | 2015 | 63.66 | 108.00 | 465.29 | 76.79% |
| C2670 | 2781 | 202.5 | 361.37 | 124 | 70.91% |
| C3540 | 4035 | 268.2 | 420.38 | 1823. | 76.95% |
| C5315 | 5982 | 419.8 | 841.02 | 499 | 83.15% |
| C7552 | 8408 | 126 | 1865.72 | n/a | n/a |

6.0 Multiple Signature Analysis with a Single Reference
6.1 Basis of the Scheme

Usually, checking n signatures requires n references. These references must be somehow stored in a ROM as in the CMS scheme, or built in the SO as in the FMS scheme. However, if all the references are made identical, say all equal to 0, then only one reference needs to be stored. Thus, the hardware requirement for checking identical multiple signatures can be as small as that for any single signature scheme, and is independent of the number of checked signatures. The control of the signature checking does not result in extra hardware overhead to the conventional BIST controller if the check points are equidistantly scheduled. Having one constant reference signature for all check points is a fundamental aspect of the invention. A technique for achieving identical reference signatures that does not entail any hardware overhead nor any circuit modification will now be discussed.

6.2 Achieving Identical Reference Signatures

Assume a set of random vectors is applied to a fault-free CUT such that a fault-free sequence of length l results. Assume the checking of n k-bit signatures at the predetermined check points $l_1, l_2, \ldots, l_n$ (these check points can be arbitrary). For a fault-free sequence, if it is assumed that each of the sequence bits is statistically independent and equally likely to be 0 or 1, then the probability for each signature to be equal to a given value, say equal to $0 \ldots 0$, is $2^{-k}$. Thus, for such a arbitrary fault-free sequence, the probability that all signatures be identical and equal to a specific value is $2^{-nk}$. If the value of the single reference is unrestricted, i.e., the signatures are allowed to be any one of the $2^k$ possible values as long as they are identical, then this probability becomes $2^{-(n-1)k}$. This probability is very small for practical values of n and k. Thus, in general, it is unlikely that the n signatures would be identical.

However, if there exists a choice of many different fault-free sequences, which is possible by applying different sets of random vectors to the CUT, then the probability that one of these sequences yields n identical signatures at the predetermined check points can be very high. As shown above, given one sequence, the probability is $2^{-nk+k}$. Given a choice between two sequences, the probability that at least one of the two yields n identical signatures follows a geometric distribution, i.e., the probability is $2^{-nk+k}+(1-2^{-nk+k})2^{-nk+k}$. Given L possible fault-free sequences, the probability that at least one of the sequences yields n identical k-bit signatures is:

$$C_{L,n,k} = \sum_{i=1}^{L} (1 - 2^{-nk+k})^{i-1} \cdot 2^{-n+1} \qquad (9)$$

or $$C_{L,n,k} = 1 - (1 - 2^{-nk+k})^L \qquad (10)$$

The probability $C_{L,n,k}$ is a measure of confidence of finding at least one sequence from L sequences that yields n identical signatures. Obviously, $C_{L,n,k} \to 1$ as $L \to \infty$. Therefore, n identical signatures can be highly probable if L can be made sufficiently large. The feasibility of this scheme rests upon how efficiently the L fault-free sequences can be obtained, as well as how large L must be, as discussed below.

6.3 Sequence Generation and Selection

As shown above, L will in practice tend to be large. Thus, successful implementation of the invention depends on the efficiency of generating the fault-free sequences by logic simulation, and of searching the sequences for one that yields identical signatures. Techniques for these tasks will now be described.

6.3.1 Efficient Generation of Fault-Free Sequences

A simple way to generate L fault-free sequences is to apply L different sets of random vectors to the CUT and choose the set of random vectors that generates n identical signatures as the test vector set. To generate L sequences, one may try L input pattern generator ("IPG") LFSRs with different feedback polynomials, or try L different seeds of the IPG LFSR. However, both of these methods imply simulating the CUT L times, each for l test vectors. Thus, the corresponding time complexity is $O(l_L)$ (disregarding the dependency of the simulation on the CUT parameters), which may become unacceptable for large l and L. A more efficient technique is presented next.

Figure 9:
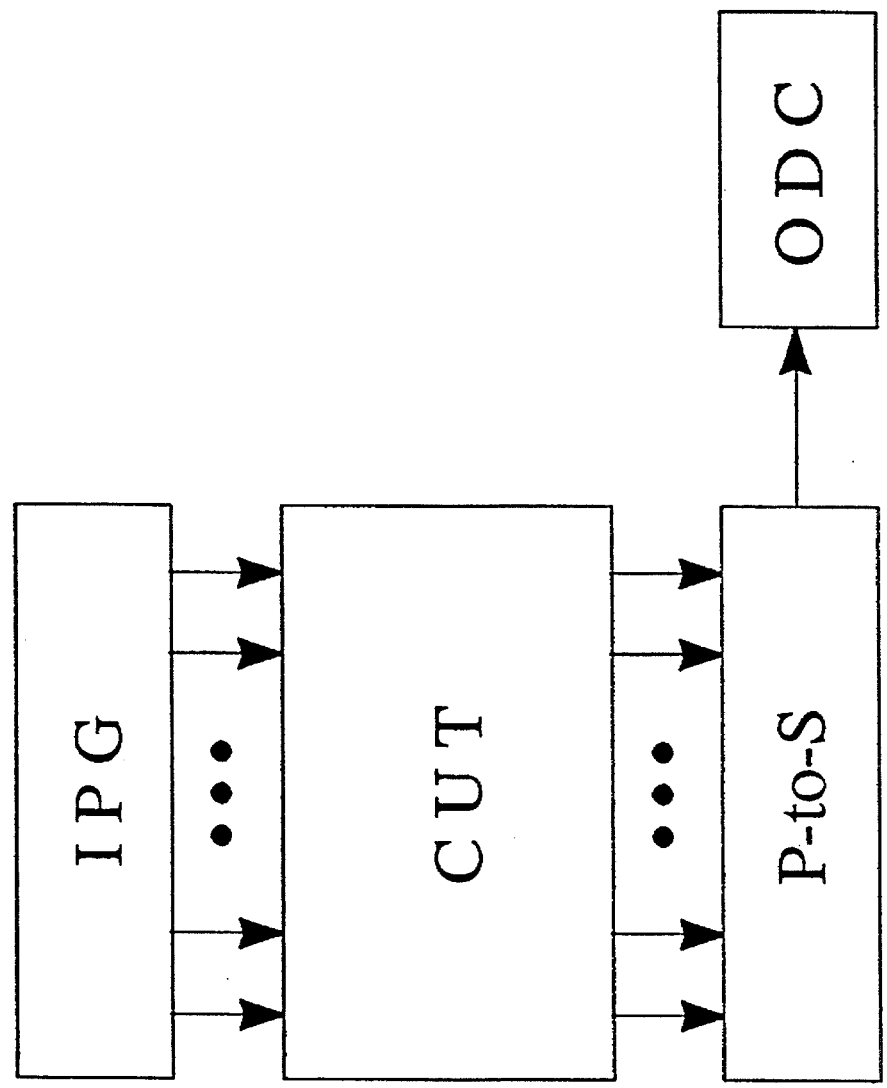
FIG. 9 is a block diagram of a hardware model used to verify the performance of the invention.

First, consider the case where the P-to-S converter in FIG. 9 is such that every input pattern to the CUT results in a single bit output, i.e., l patterns yield l output bits. Denote the fault-free output sequence by $b_1, b_2, \ldots, b_l$. Shifting the IPG LFSR one more time, which is equivalent to simulating the CUT for a total of l+1 test vectors, yields one more output bit $b_{l+1}$. From the (l+1)-bit sequence, there exists two possible sequences of l consecutive bits. One is the sequence $b_1, b_2, \ldots, b_l$. The other is $b_2, b_3, \ldots, b_{l+1}$. These two sequences are very unlikely to be the same since the probability for the two sequences to be identical is extremely small (approximately $2^{-l}$). Clearly, shifting the IPG LFSR L−1 more times, i.e., simulating the CUT with a total of l+L−1 test vectors, yields l+L−1 output bits, $b_1, b_2, \ldots, b_{l+L-1}$. Such a l+L−1 bit sequence yields the choice of L fault-free sequences of length l. The time complexity of this generation technique is only O(l+L), which is simply a linear increase in the necessary time to generate a single l-bit fault-free output sequence.

The above method for generating fault-free sequences can also be applied to the case where the P-to-S converter is a scan chain. With a scan chain of length m, each input vector yields m output bits to compact. In this case, the IPG LFSR requires only (l+L−1)/m shifts to generate L fault-free sequences. Thus, the sequence generation time complexity is only $O(\{l+L\}/\{m\})$ if the P-to-S is a m-stage scan chain.

6.3.2 Adequate Sequence Selection

As shown above, a fault-free sequence of length l+L−1 yields a choice of L sequences of length l. Each of the latter sequences is actually a subsequence of the (l+L−1)-bit sequence. Given a (l+L−1)-bit fault-free sequence, an efficient algorithm to search for an adequate subsequence of length l that yields identical signatures is now presented.

The following example shows the basic concept of the way in which an adequate sequence can be selected.

Figure 10:
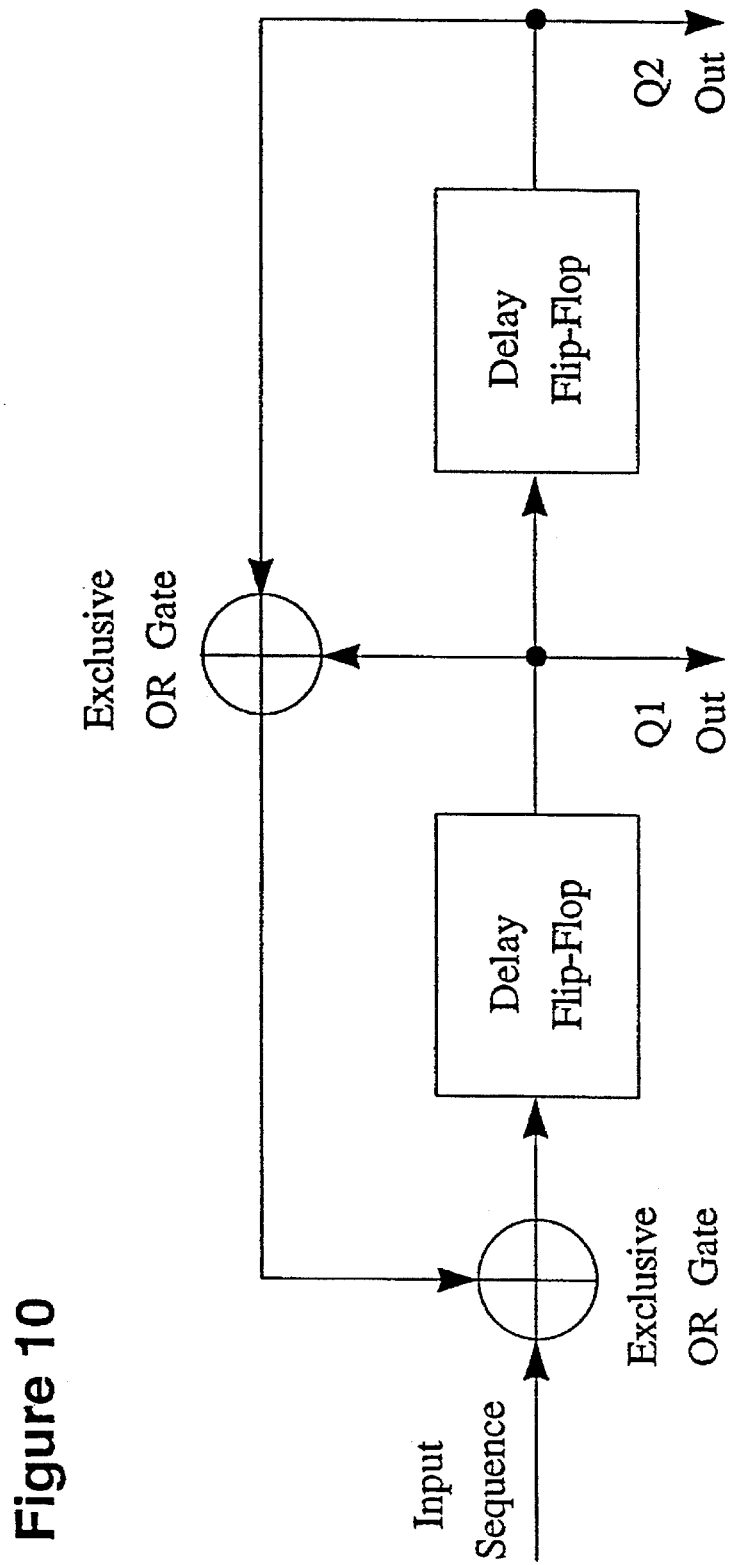
FIG. 10 is a block diagram of a two stage linear feedback shift register for checking two signatures.

Example: Use the 2-stage LFSR shown in FIG. 10 to check 2 signatures. Assume the initial state of the LFSR is (00), l=8, and L=4. If $l_1$=4, and $l_2$=l=8, i.e., check a signature after every four bits being shifted into the LFSR. Given the (l+L−1)-bit sequence to compact as:

1 1 1 1 0 1 0 1 1 0 0 the eleven transient LFSR states after every shift are shown below:

(10 ) (01) (00)(10) (11) (11) (0) (00) (10) (11) (01)

An examination of the transient states shows that starting with the seed (01) the 8-bit subsequence (1 1 0 1 0 1 1 0) would yield two identical signatures at $l_1$=4 and $l_2$=8. The value of the signatures is (11). The eight transient LFSR states, starting with seed (01), when the subsequence (1 1 0 1 0 1 1 0) is applied are shown below:

(00) (10) (11) (11) (01) (00) (10) (11)

In the above example, all the transient LFSR states are pre-calculated and stored. Storing these states may require a large memory space. An efficient searching algorithm which is based on a similar idea as shown in the example, but which avoids the requirement of storing these transient states, will now be described. Assume the (l+L−1)-bit fault-free sequence is $M=b_1, b_2, \ldots, b_{l+L-1}$, where $b_1$ is the first bit to compact. To simplify the algorithm, denote the initial seed to the signature LFSR by $s_0$. The searching algorithm is shown in the following pseudo-procedure:

```
search.process(M, L, n, k, l₁, l₂, ..., lₙ)
    seed = s₀ = 0; l₀ = 0;
        for(i=1 to n) do
            initialize the signature LFSR with seed;
            j = i − 1;
            calculate the signature sᵢ by shifting the
            sequence bits
            b_{lj+1}, b_{lj+2}, ..., b_{lj+li} into the LFSR;
            seed = sᵢ;
        endoffor
        i = 1;
        while((the signatures s₁, s₂, ..., sₙ are not
        identical)&&(i ≤ L)) do
            for(j = 0 to n) do
                initialize the signature LFSR to the
                value of sⱼ;
                calculate a new sⱼ by shifting bit b_{i+lj}
                into the signature LFSR;
            endoffor
            i = i + 1;
        endofwhile
        if(i > L) then print "fail to find an adequate
        sequence";
        else print the results i, the value of the signa-
        tures, and the signature LFSR seed that results
        in the identical signatures, i.e., s₀;
    endofsearch.
```

This search is very fast, and takes little memory. For example, when $l=2^{16}$ and $L=2^{220}$, the search takes only a few seconds on a Sun SparcStation™ 2.

6.4 Feasibility and Aliasing Performance of the Scheme

The magnitude of L required to ensure certain confidence for successfully using the invention (i.e. the amount of CPU time overhead required to implement the invention) is now discussed.

6.4.1 Required L vs. Aliasing Performance of the Scheme

Given n, k, and a desired confidence C of success in finding an adequate sequence, the required L can be obtained by solving Equation 10 with $C_{L,n,k}=C$. Some results are shown in Table 3:

TABLE 3

| L | C (%) |
|---|---|
| $2^{nk-k+1}$ | 86.47 |
| $2^{nk-k+2}$ | 98.17 |
| $2^{nk-k+3}$ | 99.97 |

From Table 1, if nk−k=16, $L=2^{17}$ is required to ensure 86% confidence, and $L=2^{18}$ is required for a confidence of 98%. With nk−k=16, some examples of n, k, and corresponding aliasing probability Pat, are shown in Table 4.

TABLE 4

| k | n | $P_{al}$ |
|---|---|---|
| 1 | 17 | $2^{-17}$ |
| 2 | 9 | $2^{-18}$ |

TABLE 4-continued

| k | n | $P_{a1}$ |
|---|---|---|
| 4 | 5 | $2^{-20}$ |
| 8 | 3 | $2^{-24}$ |
| 16 | 2 | $2^{-32}$ |

From Tables 3 and 4, if $L=2^{17}$, one has 86% confidence of finding five identical signatures each of length 4, which corresponds to an aliasing probability $P_{al}=2^{-20}$; or, with the same confidence, one can find two identical 16-bit signatures thus $P_{al}=2^{-32}$. If $L=2^{18}$, the confidence goes up to 98%.

C, L and k are directly related to the desired confidence, allowed CPU time overhead, and affordable hardware area, respectively. Given C, L and k, the expected number of identical signatures can be found by solving Eqnuation 10 for n. In terms of these parameters, the aliasing probability is:

$$P_{al} = 2^{-nk} = 2^{-(k-\frac{\ln(1-exp(\frac{\ln(1-c)}{L}))}{\ln 2})} \quad (11)$$

6.4.2 CPU Time Overhead

The CPU time required to implement the preferred embodiment involves two aspects. One is the effort in generating the L fault-free sequences; the other is the effort spent in searching an adequate sequence among the L sequences. With the algorithm presented above, the searching requires only a negligible amount of CPU time. Thus, the major CPU time required is that of generating the L fault-free sequences, which is in fact the CPU time required for simulating the fault-free CUT to get L−1 extra output bits. Disregarding the dependency of the simulation on the CUT parameters, the required CPU time for obtaining L−1 extra output bits is proportional to L. Similarly, the CPU time for simulating a CUT to get a l-bit fault-free sequence is proportional to l. Thus, the CPU time overhead is L/l relative to the effort required to generate an l-bit fault-free output sequence by logic simulation.

Assuming an output sequence length $l=2^{20}$, which is not too long in practice, especially when a scan chain is used, yields 12.5% CPU time overhead for $L=2^{17}$, and 25% overhead for $L=2^{18}$. For example, with 25% CPU time overhead, there is over 98% confidence of achieving $P_{al}=2^{-20}$ with k=8, or $P_{al}=2^{-32}$ with k=16. Such percentages of CPU time overhead are acceptable in practice. For example, it takes only 0.2 minutes to simulate a 40,000 gate fault-free CUT with $2^{20}$ test vectors. Thus, in this case, $L=2^{18}$ means only 3 seconds of extra CPU time. When only a fault-free sequence is required, simulation techniques based on higher-level circuit descriptions, e.g., functional or behavioral level descriptions, can be used, thus making the simulation process much faster. In some cases, if some "proven" fault-free circuits ("golden circuits") are available, the required fault-free sequence can be obtained by running these circuits.

The CPU time overhead can be further reduced by combining the logic simulation for fault-free sequence generation with the searching for identical signatures, i.e., generating a fault-free sequence and concurrently determining whether any of its subsequences generated so far yields n identical signatures. Once such a subsequence is found, the process terminates. In this case, the average CPU time overhead can be significantly reduced, since the average number of extra output bits that must be generated is much smaller than L. This average number is $2^{k-k}$, which is the mean value of a random variable characterized by a geo-metric distribution with parameter $2^{-nk+k}$ [10]. For the cases shown in Table 4, where nk−k=16, the average CPU time overhead can be reduced to 6.25% from 12.5% or 25%.

6.5 Special Case: k=1

A special case arises for k=1, which yields $P_{al}=2^{-n}$ if n 1-bit signatures are checked. In this case, the hardware requirement is only a 1-stage LFSR. Moreover, the storage of the single reference required in the general case can be avoided if the state of the 1-stage LFSR at each check point is directly used as a go/nogo signal. The case where k=1 can be considered as a minimal hardware requirement for signature analysis.

When $P_{al}=2^{-n}$ is desired, from Table 3, $L=2^n$ is required to ensure 86% confidence, or $L=2^{n+1}$ for a confidence of over 98%. Theoretically, with a 1-stage LFSR, the invention can achieve arbitrarily small aliasing if L is sufficiently large. Assuming k=1 and $l=2^{20}$, achieving the typical aliasing probability of $2^{-16}$ requires 6.25% CPU time overhead for 86% confidence, or 12.5% overhead for 98% confidence. Similarly to the discussion above, the average CPU time overhead in this case is only 3.125%.

7.0 Experimental Results for Achieving Identical References

To verify the feasibility of the invention, 150 experiments on the ISCAS'85 benchmark circuits (Brglez et al, supra) were performed. In the experiments, a multiple input non-feedback shift register ("MINSR") was used as the P-to-S converter shown in FIG. 9. The signatures are checked at equidistant check points. This makes the corresponding hardware requirements for the control of checking multiple signatures as small as that for the control of any single signature scheme. In the experiments, for each given set of n and k, three trials were performed with each of the circuits. Table 5 shows the experimental results when nk−k=16:

TABLE 5

| | Log₂ of the number of extra output bits | | | | |
|---|---|---|---|---|---|
| Circuit Name | n = 17, k = 1 | n = 9, k = 2 | n = 5, k = 4 | n = 3, k = 8 | n = 2, k = 16 |
| C432 | 15.79 | 14.94 | 16.19 | 15.87 | 17.01 |
| C499 | 14.07 | 15.29 | 15.72 | 14.65 | 15.08 |
| C880 | 16.49 | 16.15 | 14.46 | 15.61 | 16.27 |
| C1355 | 14.07 | 15.29 | 15.72 | 14.65 | 15.08 |
| C1908 | 15.86 | 15.57 | 16.36 | 15.81 | 16.08 |
| C2670 | 16.95 | 15.36 | 15.64 | 16.21 | 14.06 |
| C3540 | 15.46 | 14.50 | 17.22 | 15.08 | 17.26 |
| C5315 | 14.38 | 17.21 | 16.49 | 16.68 | 15.60 |
| C6288 | 16.79 | 15.35 | 15.64 | 16.23 | 15.34 |
| C7552 | 16.98 | 16.87 | 16.67 | 16.50 | 15.72 |
| averages | 15.68 | 15.65 | 16.01 | 15.73 | 15.75 |
| | Average = 15.76 | | | | |

As shown in Table 5, to find 17 identical 1-bit signatures, yielding $P_{al}=2^{-17}$, requires the generation of $2^{15.68}$ extra output bits on average. To find 2 identical 16-bit signatures thus yielding $P_{al}=2^{-32}$, requires $2^{15.75}$ extra output bits on average. Theoretically, the average number of extra output bits that must be generated is $2^{nk-k}=2^{16}$. In comparison, the last row of Table 5 shows that the average number of the required extra output bits over the 150 experiments is $2^{15.76}$. This result is very close to the theoretical expectation. If $l=2^{20}$, $2^{16}$ extra output bits translates into a CPU time overhead of only 6.25%, and $2^{15.76}$ represents a CPU time overhead of 5.29%.

8.0 A General Technique to Reduce m

The foregoing techniques for generating fault-free sequences can be used not only to select an adequate sequence but also to reduce the number of references in the FMS scheme, i.e., to make 1<m<n, as will now be explained.

The FMS scheme eliminates the one-to-one correspondence between the references and the checked signatures. This makes it possible to can use fewer references than signatures, i.e., m<n. In this case, n−m of the n references used in the conventional case are made identical. To do so, the techniques described above for fault-free sequence generation can be used. A suitable technique for adequate sequence selection will now be described. Assume the (L+l−1)-bit fault-free sequence to be $M = b_1, b_2, \ldots, b_{l+L-1}$, where $b_1$ is the first bit to compact. To simplify the algorithm, denote the initial seed to the signature LFSR by $s_0$. For given m and n, the searching algorithm is as follows:

```
search.process(M, L, m, n, k, l₁, l₂, ..., lₙ)
    seed = s₀ = 0; l₀ = 0;
    for(i=1 to n) do
            initialize the signature LFSR with seed;
            j = i−1;
            calculate the signature sᵢ by shifting the
            sequence bits
            b_{lj+1}, b_{lj+2}, ..., b_{lj+li} into the LFSR;
            seed = sᵢ;
    endoffor
    i = 1;
    while((the number of identical signatures is
    smaller than n−m)&&(i ≤ L)) do
            for(j=0 to n) do
                    initialize the signature LFSR to the
                    value of sⱼ;
                    calculate a new sⱼ by shifting bit b_{i+lj}
                    into the signature LFSR;
            endoffor
            i = i + 1;
    endofwhile
    if(i > L) then print "fail to find an adequate
    sequence";
    else print the results i, and s₀, s₁, s₂, ..., sₙ;
endofsearch.
```

9.0 Augmentation of the FMS Scheme's Reference Set

It is possible to use the FMS scheme while making the reference set also include members that do not correspond to any of the reference signatures that would produced at the n check points by a circuit in the absence of one or more faults. This insertion of such extra "dummy" members into the reference set could could lead to a situation wherein m would exceed n. There could be situations in which such augmentation of the set of references would result in a preferred implementation of the SO.

10.0 Alternatives to LFSRs for Computing Signatures

The previous sections have all assumed that the structure which computes the signatures from a CUT would be a LFSR. However, there exist many other known structures for compacting CUT test output responses, e.g., cellular automata, counters (ones, edges, transitions) etc. The latter alternative structures may be linear or non linear and circuit specific or independent. The FMS and similar reference signature schemes described in the preceding sections can be applied regardless of the type of compactor used to generate the signatures. The above analysis has assumed LFSRs, which are currently the most commonly used type of compactors for testing digital integrated circuits. Nevertheless, alternative compactors may be preferred in some applications.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method of testing a digital integrated circuit for faults, said digital integrated circuit comprising one or more inputs and one or more outputs, wherein the state of said one or more outputs of said digital integrated circuit is responsive to signals at said one or more inputs, said method comprising the steps of:

(a) providing a means to apply a sequence of test vectors to said one or more inputs of said digital integrated circuit;

(b) providing a means to generate a signature $s_i$ determined by a sequence of states of said one or more outputs of said digital integrated circuit;

(c) selecting a sequence of test vectors;

(d) establishing a plurality of n check points $l_1, l_2, \ldots, l_n$, where n>1, in said sequence of test vectors;

(e) defining a set of m reference vectors, $r_1, r_2, \ldots, r_m$, where m>1, said set of m reference vectors corresponding to signatures produced by said digital integrated circuit at said check points $l_1, l_2, \ldots, l_n$ in the absence of any faults in said digital integrated circuit, (f) applying said sequence of test vectors to said one or more inputs of said digital integrated circuit to cause said one or more outputs of said digital integrated circuit to pass through a sequence of states of said one or more outputs;

(g) at each check point $l_i$, where $1 \leq i \leq n$, of said plurality of n check points:

(i) deriving a signature $s_i$ from a sub-sequence of states of said one or more outputs of said digital integrated circuit said sub-sequence of states ending at said check point $l_i$;

(ii) comparing said derived signature $s_i$ with reference vectors from said set of m reference vectors;

(iii) rejecting said digital integrated circuit if said derived signature does not match any of said set of m reference vectors; and (h) passing said digital integrated circuit if each derived signature $s_i$ matches at least one member of said set of m reference vectors.

2. The method of claim 1 wherein said means to generate a signature $s_i$ representative of a sequence of states of said one or more outputs of said digital integrated circuit comprises a data compactor and said step of deriving a signature $s_i$ from said sub-sequence of states of said outputs of said digital integrated circuit at said check point $l_i$ comprises compacting a vector corresponding to said sub-sequence of states of said one or more outputs of said digital integrated circuit in said data compactor.

3. The method of claim 2 where m=n.

4. The method of claim 2 where m>n.

5. The method of claim 2 where 1<m<n.

6. The method of claim 2 where m=1 and n is greater than 1.

7. A method of testing a digital integrated circuit for faults, comprising the steps of:

(a) establishing a plurality of n check points $l_1, l_2, \ldots, l_n$, where n>1 in a test sequence;

(b) defining a set of m references, $r_1, r_2, \ldots, r_m$, where m>1, said set of m references corresponding to signatures produced by said digital integrated circuit at said plurality of n check points $l_1, l_2, \ldots, l_n$ in the absence of any faults in said digital integrated circuit;

(c) applying said test sequence to said digital integrated circuit;

(d) for each check point $l_i$, where $1 \leq i \leq n$, of said plurality of n check points:
  (i) deriving a signature $s_i$ from said digital integrated circuit at said check point $l_i$;
  (ii) comparing said derived signature $s_i$ with members of said set of m references;
  (iii) rejecting said digital integrated circuit if said derived signature does not match any of said members of said set of m references; and
(e) passing said digital integrated circuit if each derived signature $s_i$ matches at least one member of said set of m references.

8. The method of claim 7 where m=n.
9. The method of claim 7 where m>n.
10. The method of claim 7 where 1<m<n.
11. The method of claim 7 where m=1 and n is greater than 1.
12. A method of testing a digital integrated circuit for faults, said method comprising the steps of:
  (a) selecting a sequence of test vectors to apply to said digital integrated circuit;
  (b) breaking said sequence of test vectors into a plurality of n sub-sequences, each of said plurality of n sub-sequences terminating at one of a plurality of n check points $l_1, l_2, \ldots, l_n$;
  (c) defining a set of m references $r_1, r_2, \ldots, r_m$ corresponding to signatures produced by said digital integrated circuit at said plurality of n check points $l_1, l_2, \ldots, l_n$ in the absence of any faults in said digital integrated circuit;
  (d) applying said sequence of test vectors to said digital integrated circuit and, at each check point $l_i$, where $1 \leq i \leq n$, of said plurality of n check points:
    (i) deriving a signature $s_i$ from said digital integrated circuit at said check point $l_i$;
    (ii) comparing said derived signature $s_i$ with said set of m references to determine whether or not said derived signature $s_i$ matches any member of said set of m references;
    (iii) passing said digital integrated circuit if, at all of said plurality of n check points, said derived signature $s_i$ matches at least one member of said set of m references; and,
    (iv) rejecting said digital integrated circuit if, at any of said plurality of n check points, said derived signature $s_i$ matches no members of said set of m references.

13. The method of claim 12 where m=n.
14. The method of claim 12 where m>n.
15. The method of claim 12 where 1<m<n.
16. The method of claim 12 where m=1 and n is greater than 1.
17. The method of claim 12 wherein said sub-sequences are not all identical.
18. The method of claim 12 wherein said sub-sequences are not all equal in length.

* * * * *

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

line 3 of the Abstract, replace "m references $r_1, r_2, ..., r_m$" with --$m$ references $r_1, r_2, ..., r_m$--.

of the patent cover sheets, line 7 of the Abstract, replace "$s_i$" with --$s_i$--.
of the patent cover sheets, line 8 of the Abstract, replace "$l_i$" with --$l_i$--.
of the patent cover sheets, column 1, line 17 replace "SeP" with --Sep--.
of the patent cover sheets, column 1, line 20, replace "Kluwev" with --Kluwe--.

In the Drawings:
In Sheet 4, Figure 4, replace "Log" with --$Log_2$--.
In Sheet 5, Figure 5, replace "Log" with --$Log_2$--.
In Sheet 6, Figure 6, replace "Log" with --$Log_2$--.

Column 2, line 13, replace "n check points $l_1, l_2, ..., i_n$" with --$n$ check points $l_1, l_2, ..., l_n$--.
Column 2, line 15, replace " m " with --$m$--.
Column 2, line 16, replace "m" with --$m$--.
Column 2, line 19, replace "si" with --$s_i$--.
Column 2, line 20, replace "$l_i$" with --$l_i$--.
Column 3, line 6, replace "by l" with --by $l$--.
Column 3, line 6, replace "by k" with --by $k$--.
Column 3, line 8, replace "$P_{at}$" with --$P_{at}$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 3, lines 10 to 12, Formula (1) should appear as follows:

$$P_{al} = \frac{2^{l-k}-1}{2^l-1}$$

Column 3, line 13, replace "l>>k yields $P_{al} \approx 2^{-k}$" with --$l \gg k$ yields $P_{al} \approx 2^{-k}$--.
Column 3, line 19, replace "$l_1$ bits" with --$l_1$ bits--.
Column 3, line 21, replace "length l" with --length $l$--.
Column 3, line 27, replace "l>>k yields $P_{al}(2) \approx 2^{-2k}$" with --$l_1 \gg k$ yields $P_{al}(2) \approx 2^{-2k}$--.
Column 3, line 28, replace "$P_{al}(n) \approx 2^{-nk}$ if n" with --$P_{al}(n) \approx 2^{-nk}$ if $n$--.
Column 3, line 28, replace "$l_1, l_2$" with --$l_1, l_2$--.
Column 3, line 29, replace "$l_n$, respectively" with --$l_n$, respectively--.
Column 3, line 29, replace "k<<$l_1$<$l_2$<...<$l_n$=1" with --$k \ll l_1 < l_2 < ... < l_n = 1$--.
Column 3, line 30, replace "l," with --$l_i$--.
Column 3, line 30, replace "ith" with --$i$th--.
Column 3, line 31, replace "the n" with --the $n$--.
Column 3, line 32, replace "$l_1, l_2, ..., l_n$ are $s_1, s_2$" with --$l_1, l_2, ..., l_n$ are $s_1, s_2$--.
Column 3, line 33, replace "$s_n$" with --$s_n$--.
Column 3, line 33, replace "ith signature $s_i$" with --$i$th signature $s_i$--.
Column 3, line 33, replace "$l_i$" with --$l_i$--.
Column 3, line 37, replace "$r_1, r_2, ..., r_n$" with --$r_1, r_2, ..., r_n$--.
Column 3, line 37, replace "ith signature $s_i$" with --$i$th signature $s_i$--.
Column 3, line 38, replace "$r_i$ at the ith" with --$r_i$ at the $i$th--.
Column 3, line 47, replace "the n" with --the $n$--.
Column 3, line 56, replace "k-bit" with --$k$-bit--.
Column 3, line 57, replace "k-bit" with --$k$-bit--.

Page 2 of 22

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 3, line 59, replace "if k" with --if $k$--.
Column 4, line 6, replace "$l_1, l_2, ..., l_n$" with --$l_1, l_2, ..., l_n$--.
Column 4, line 7, replace "$s_i$" with --$s_i$--.
Column 4, line 8, replace "$r_i$ at check point $l_i$" with --$r_i$ at check point $l_i$--.
Column 4, line 9, replace "$s_i$" with --$s_i$--.
Column 4, line 9, replace "$r_i$" with --$r_i$--.
Column 4, line 10, replace "$r_2, ..., r_n$" with --$r_2, ..., r_n$--.
Column 4, line 10, replace "$s_i$" with --$s_i$--.
Column 4, line 14, replace "$r_1, r_2, ..., r_n$" with --$r_1, r_2, ..., r_n$--.
Column 4, line 19, replace "k and n" with --$k$ and $n$--.
Column 4, line 26, replace "unecessary" with --unnecessary--.
Column 4, line 37, replace "k-input" with --$k$-input--.
Column 4, line 42, replace "n=k=3" with --$n = k = 3$--.
Column 4, line 43, replace "$r_1=111, r_2 110$, and $r_3=100$" with --$r_1=111, r_2=110$, and $r_3=100$--.
Column 4, line 44, replace "$b_1, b_2$, and $b_3$" with --$b_1, b_2$, and $b_3$--.
Column 4, lines 46 to 48, Formula (3) should appear as follows:

$$Pass/Fail = \overline{b_1 b_2 b_3 + b_1 b_2 \overline{b_3} + b_1 \overline{b_2} b_3} = \overline{b_1 b_2 + b_1 \overline{b_3}} = \overline{b_1 \overline{b_2} b_3}$$

Column 4, line 51, replace "n k-bit" with --$m$ $k$-bit--.
Column 4, line 52, replace "k-input, l-output, m-cube" with --$k$-input, 1-output, $m$-cube--.
Column 4, line 56, replace "m that" with --$m$ that --.
Column 4, line 61, replace "l-bit" with --$l$-bit--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 4, line 62, replace "k-bit" with --$k$-bit--.
Column 4, line 62, replace "$r_1$" with --$r_1$--.
Column 4, line 64, replace "to $r_1$" with --to $r_1$--.
Column 4, line 64, replace "references $r_1$" with --references $r_1$--.
Column 4, line 65, replace "$r_2$" with --$r_2$--.
Column 4, line 66, replace "$r_1$ or $r_2$" with --$r_1$ or $r_2$--.
Column 5, line 1, replace "that m" with --that $m$--.
Column 5, line 1, replace "$r_1, r_2, ..., r_m$" with --$r_1, r_2, ..., r_m$--.
Column 5, line 2, replace "l-bit" with --$l$-bit--.
Column 5, line 3, replace "m references is m" with --$m$ references is $m$--.
Column 5, line 5, replace "thus m" with --thus $m$--.
Column 5, line 7, replace "when m" with --when $m$--.
Column 5, line 13, replace "l >>k yields $P_{al} \approx m2^{-k}$" with --$l \gg k$ yields $P_{al} \approx m2^{-k}$--.
Column 5, line 14, replace "checks n" with --checks $n$--.
Column 5, line 14, replace "$l_1$" with --$l_1$--.
Column 5, line 15, replace "$l_2, ..., l_n$" with --$l_2, ..., l_n$--.
Column 5, line 15, replace "of m" with --of $m$--.
Column 5, line 15, replace "m≤n" with --$m \leq n$--.
Column 5, line 16, replace "n distinct references if n" with --$n$ distinct references if $n$--.
Column 5, line 18, replace "m<n" with --$m < n$--.
Column 5, line 27, replace "$l_i$ is the ith" with --$l_i$ is the $i$th--.
Column 5, line 28, replace "$l_i$>>k" with --$l_i \gg k$--.
Column 5, line 31, replace "k and n" with --$k$ and $n$--.
Column 5, line 32, replace "m=1" with --$m=1$--.
Column 5, line 32, replace "m=n" with --$m=n$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 5, line 33, replace "$P_{FMS} \approx [n2^{-k}]^{n}$" with --$P_{FMS} \approx [n2^{-k}]^{n}$--.
Column 5, line 35, replace "m=n" with --$m = n$--.
Column 5, line 36, replace "$L_e^{FMS}$" with --$L_e^{FMS}$--.
Column 5, line 38, replace "$L_e^{FMS}$" with --$L_e^{FMS}$--.
Column 5, line 40, replace "$L_e^{FMS}$" with --$L_e^{FMS}$--.
Column 5, line 41, replace "$L_e^{FMS}$" with --$L_e^{FMS}$--.
Column 5, line 41, replace "$P_{SS} \approx 2^{-k}$" with --$P_{SS} \approx 2^{-k}$--.
Column 5, line 42, replace "$P_{FMS} \approx [n2^{-k}]^{m}$" with --$P_{FMS} \approx [n2^{-k}]^{n}$--.
Column 5, lines 43 to 45, Formula (7) should appear as follows:

$$2^{-L_e^{FMS}} \approx [n2^{-k}]^n$$

Column 5, line 46, replace "$L_e^{FMS}$" with --$L_e^{FMS}$--.
Column 5, line 51, replace "$L_e^{CMS} = nk$" with --$L_e^{CMS} = nk$--.
Column 5, line 51, replace "$L_e^{SS} = k$" with --$L_e^{SS} = k$--.
Column 5, line 52, replace "$L_e^{FMS} = L_e^{FMS} - n\log_2(n)$ for given n and k" with --$L_e^{FMS} = L_e^{CMS} - n\log_2(n)$ for given $n$ and $k$--.
Column 5, line 56, replace "k=16 and n=4, $L_e^{SS} = 16$, $L_e^{CMS} = 64$" with --$k = 16$ and $n=4$, $L_e^{SS} = 16$, $L_e^{CMS} = 64$--.
Column 5, line 57, replace "$L_e^{FMS}$" with --$L_e^{FMS}$--.
Column 5, line 57, replace "$P_{CMS} = 2^{-64}$, $P_{FMS} = 2^{-54}$, and $P_{SS} =$" with --$P_{CMS} = 2^{-64}$, $P_{FMS} = 2^{-56}$ and $P_{SS} =$--.
Column 5, line 63, replace "k and n" with --$k$ and $n$--.
Column 5, line 64, replace "with k" with --with $k$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu Page 6 of 22

It is certified that error appears in the above identified patent and that said Letters Patent is hereby corrected as shown below:

Column 5, line 65, replace "n. For fixed k, as n increases, $L_e^{FMS}$" with --$n$. For fixed $k$, as $n$ increases, $L_e^{FMS}$--.
Column 5, line 66, replace "n=$2^k$, $L_e^{FMS}$=0" with --$n=2^k$, $L_e^{FMS}=0$--.
Column 5, line 67, replace "$L_e^{FMS}$ as a function of n for k=8, k=9, k=12 and k=16" with --$L_e^{FMS}$ as a function of $n$ for $k$=8, $k$=9, $k$=12 and $k$=16--.
Column 6, line 5, replace "m=n" with --$m=n$--.
Column 6, line 9, replace "k-bit" with --$k$-bit--.
Column 6, line 10, replace "(k/n+log2(n))" with --($k/n+\log_2(n)$)--.
Column 6, line 16, replace "k-input, s-output, n-cube" with --$k$-input, $s$-output, $n$-cube--.
Column 6, line 17, replace "(n+8)×(k×2+s)" with --($n$+8)×($k$×2+$s$)--.
Column 6, line 19, replace "um" with --$\mu m$--.
Column 6, line 22, replace "um$^2$" with --$\mu m^2$--.
Column 6, line 32, replace "k=9 and n=32, $P_{FMS}$" with --$k$=9 and $n$=32, $P_{FMS}$--.
Column 6, line 38, replace "$P_{FMS}$" with --$P_{FMS}$--.
Column 6, line 40, replace "$P_{SS}$" with --$P_{SS}$--.
Column 6, line 50, replace "log$_2$n-bit" with --log$_2 n$-bit--.
Column 6, line 51, replace "if n" with --if $n$--.
Column 6, line 51, replace "n k-bit" with --$n$ $k$-bit--.
Column 6, line 52, replace "k+log$_2$n" with --$k$+log$_2 n$--.
Column 6, line 53, replace "n cubes" with --$n$ cubes--.
Column 6, line 53, replace "k-bit" with --$k$-bit--.
Column 6, line 54, replace "log$_2$n-bit" with --log$_2 n$-bit--.
Column 6, line 60, replace "k-input" with --$k$-input--.
Column 6, line 61, replace "n-cube" with --$n$-cube--.

UNITED STATES PATENT AND TRADEMARK OFFICE
CERTIFICATE OF CORRECTION

PATENT NO :   5,475,694
DATED     :   12 December, 1997
INVENTORS :   André Ivanov, Yuejian Wu It is certified that error appears in the above identified patent and that said Letters Patent is hereby corrected as shown below:

Column 6, line 61, replace "n k-bit" with --$n$ $k$-bit--.
Column 6, line 66, replace "length k, checking n" with --length $k$, checking $n$--.
Column 6, line 67, replace "$P_{al}$ as checking n-n/klog$_2$n" with
--$P_{al}$ as checking $n$-$n$/$k$log$_2$$n$--.
Column 7, line 1, replace "k and" with --$k$ and--.
Column 7, line 2, replace "$P_{al}$" with --$P_{al}$--.
Column 7, line 8, replace "k=8 and k=12" with --$k$ =8 and $k$ =12--.
Column 7, line 10, replace "k =8" with --$k$ =8--.
Column 7, line 11, replace "$P_{al}$ >2$^{-120}$. When k=12, and for $P_{al}$" with --$P_{al}$ >2$^{-120}$. When $k$=12, and for $P_{al}$--.
Column 7, line 13, replace "k=16, for $P_{al}$" with --$k$=16, for $P_{al}$--.
Column 7, line 15, replace "k, when $P_{al}$" with --$k$, when $P_{al}$--.
Column 7, line 18, replace "n when k" with --$n$ when $k$--.
Column 7, line 61, replace "l$_i$ and l$_{i+1}$" with --$l_i$ and $l_{i+1}$--.
Column 8, line 7, replace "l$_i$ and l$_{i+1}$ is constant for all i" with --$l_i$ and $l_{i+1}$ is constant for all $i$--.
Column 8, line 8, replace "q is" with --$q$ is--.
Column 8, line 10, replace "q-bit" with --$q$-bit--.
Column 8, line 30, replace "l$_i$ and l$_{i+1}$" with --$l_i$ and $l_{i+1}$--.
Column 8, line 31, replace "q$_i$" with --$q_i$--.
Column 8, line 33, replace "q$_s$, where q$_s$=min q$_i$" with --$q_s$, where $q_s$=min $q_i$--.
Column 8, line 35, replace "i=1, ..., n-1" with --$i$=1, ..., $n$-1--.
Column 8, line 36, replace "n-1" with --$n$-1--.
Column 8, line 40, replace "n counts" with --$n$ counts--.
Column 8, line 61, delete ", pp. 151-158".
Column 8, line 67, replace "primitive" with --primitive polynomial--.
Column 9, line 3, replace "k=8 and n=8" with --$k$=8 and $n$=8--.

UNITED STATES PATENT AND TRADEMARK OFFICE
CERTIFICATE OF CORRECTION

PATENT NO : 5,475,694    Page 8 of 22
DATED : 12 December, 1997
INVENTORS : André Ivanov, Yuejian Wu It is certified that error appears in the above identified patent and that said Letters Patent is hereby corrected as shown below:

Column 10, line 1, replace "checking n signatures requires n" with --checking $n$ signatures requires $n$--.
Column 10, line 19, replace "length l" with --length $l$--.
Column 10, line 20, replace "n k-bit" with --$n$ $k$-bit--.
Column 10, line 21, replace "l$_1$, l$_2$, ..., l$_n$" with --$l_1, l_2, ..., l_n$--.
Column 10, line 32, replace "n and k" with --$n$ and $k$--.
Column 10, line 33, replace "the n" with --the $n$--.
Column 10, line 37, replace "yields n" with --yields $n$--.
Column 10, line 41, replace "yields n" with --yields $n$--.
Column 10, lines 42 and 43, replace "$2^{-nk+k}+(1-2^{-nk+k})2^{-nk+k}$" with --$2^{-nk+k}+(1-2^{-nk+k})2^{-nk+k}$--.
Column 10, line 43, replace "Given L" with --Given $L$--.
Column 10, line 44, replace "yields n" with --yields $n$--.
Column 10, line 45, replace "k-bit" with --$k$-bit--.
Column 10, lines 51 and 52, Formula (10) should appear as follows:

$$C_{L,n,k} = 1 - (1 - 2^{-nk+k})^L$$

Column 10, line 53, replace "C$_{L,n,k}$" with --$C_{L,n,k}$--.
Column 10, line 54, replace "L sequences that yields n" with --$L$ sequences that yields $n$--.
Column 10, line 55, replace "C$_{L,n,k}$ →1 as L→∞" with --$C_{L,n,k} \to 1$ as $L \to \infty$--.
Column 10, line 56, replace "n identical" with --$n$ identical--.
Column 10, line 56, replace "if L" with --if $L$--.
Column 10, line 58, replace "the L" with --the $L$--.
Column 10, line 59, replace "L must" with --$L$ must--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 10, line 61, replace "L will" with --$L$ will--.
Column 11, line 1, replace "generate L" with --generate $L$--.
Column 11, line 2, replace "apply L" with --apply $L$--.
Column 11, line 3, replace "n identical" with --$n$ identical--.
Column 11, line 4, replace "generate L" with --generate $L$--.
Column 11, line 5, replace "try L" with --try $L$--.
Column 11, line 6, replace "try L" with --try $L$--.
Column 11, line 8, replace "L times, each for l test" with --$L$ times, each for $l$ test--.
Column 11, line 9, replace "O($1_L$)" with --O($Ll$)--.
Column 11, line 11, replace "l and L" with --$l$ and $L$--.
Column 11, line 15, replace "l patterns yield l" with --$l$ patterns yield $l$--.
Column 11, line 16, replace "b$_1$, b$_2$, ..., b$_l$" with --$b_1, b_2, ..., b_l$--.
Column 11, line 18, replace "l+1" with --$l$+1--.
Column 11, line 19, replace "b$_{l+1}$. From the (l+1)-bit" with --$b_{l+1}$. From the ($l$+1)-bit--.
Column 11, line 20, replace "of l" with --of $l$--.
Column 11, line 21, replace "b$_1$, b$_2$, ..., b$_l$. The other is b$_2$, b$_3$, ..., b$_{l+1}$" with --$b_1, b_2, ..., b_l$. The other is $b_2, b_3, ..., b_{l+1}$--.
Column 11, line 25, replace "L-1" with --$L$-1--.
Column 11, line 26, replace "l+L-1 test" with --$l$+$L$-1 test--.
Column 11, line 26, replace "l+L-1 output bits, b$_1$, b$_2$" with --$l$+$L$-1 output bits, $b_1, b_2$--.
Column 11, line 27, replace "b$_{l+L-1}$" with --$b_{l+L-1}$--.

UNITED STATES PATENT AND TRADEMARK OFFICE
CERTIFICATE OF CORRECTION

PATENT NO :    5,475,694
DATED    :    12 December, 1997
INVENTORS :    André Ivanov, Yuejian Wu It is certified that error appears in the above identified patent and that said Letters Patent is hereby corrected as shown below:

Column 11, line 27, replace "l+L-1" with --$l+L-1$--.
Column 11, line 27, replace "of L" with --of $L$--.
Column 11, line 28, replace "length l" with --length $l$--.
Column 11, line 29, replace "O(l+L)" with --O($l+L$)--.
Column 11, line 30, replace "l-bit" with --$l$-bit--.
Column 11, line 34, replace "length m" with --length $M$--.
Column 11, line 35, replace "yields m" with --yields $M$--.
Column 11, line 36, replace "(l+L-1)/m" with --($l+L-1$)/$M$--.
Column 11, line 36, replace "generate L" with --generate $L$--.
Column 11, line 38, replace "O({l+L}/{m})" with --O({$l+L$}/{$M$})--.
Column 11, line 38, replace "m-stage" with --$M$-stage--.
Column 11, line 40, replace "l+L-1" with --$l+L-1$--.
Column 11, line 41, replace "L sequences of length l" with --$L$ sequences of length $l$ --.
Column 11, line 42, replace "(l+L-1)-bit" with --($l+L-1$)-bit--.
Column 11, line 43, replace "(l+L-1)-bit" with --($l+L-1$)-bit--.
Column 11, line 45, replace "length l" with --length $l$--.
Column 11, line 50, replace "l=8, and L=4. If l₁=4, and l₂=l=8" with --$l$=8, and $L$=4. If $l_1$=4, and $l_2$=$l$=8--.
Column 11, line 52, replace "(l+L-1)-bit" with --($l+L-1$)-bit--.
Column 11, line 62, replace "l₁=4 and l₂=8" with --$l_1$=4 and $l_2$=8--.
Column 12, line 6, replace "(l+L-1)-bit" with --($l+L-1$)-bit--.
Column 12, line 7, replace "M=b₁, b₂, ..., b_{l+L-1}, where b₁" with --$M$=$b_1$, $b_2$, ..., $b_{l+L-1}$, where $b_1$ --.
Column 12, line 9, replace "s₀" with --$s_0$ --.
Column 12, line 10, replace "pseudo-procedure" with --pseudo-code procedure--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 12, lines 14 through 34, should appear as follows:

```
search.process(M, L, n, k, l₁, l₂, ..., lₙ)
    seed = s₀ = 0; l₀ = 0;
        for(i=1 to n) do
            initialize the signature LFSR with seed;
            j = i - 1;
            calculate the signature sᵢ by shifting the sequence bits
            b_{lj+1}, b_{lj+2}, ..., b_{lj+li} into the LFSR;
            seed = sᵢ;
        endoffor
        i = 1;
        while((the signatures s₁, s₂, ..., sₙ are not identical)&&(i ≤ L)) do
            for(j = 0 to n) do
                initialize the signature LFSR to the value of sⱼ;
                calculate a new sⱼ by shifting bit b_{r+lj} into the signature LFSR;
            endoffor
            i = i + 1;
        endofwhile
        if(i > L) then print "fail to find an adequate sequence";
        else print the results i, the value of the signatures, and the signature LFSR seed
        that results in the identical signatures, i.e., s₀;
    endofsearch.
```

Column 12, line 38, replace "l=$2^{16}$ and L=$2^{220}$" with --$l$=$2^{16}$ and $L$=$2^{20}$--.
Column 12, line 41, replace "of L" with --of $L$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 12, line 45, replace "Required L" with --Required $L$ --.
Column 12, line 46, replace "Given n, k" with --Given $n, k$ --.
Column 12, line 47, replace "L can" with --$L$ can--.
Column 12, lines 50 through 56, Table 3 should appear as:

| $L$ | C (%) |
|---|---|
| $2^{nk-k+1}$ | 86.47 |
| $2^{nk-k+2}$ | 98.17 |
| $2^{nk-k+3}$ | 99.97 |

Column 12, line 58, replace "nk-k=16, L=$2^{17}$" with --$nk - k$ =16, $L$=$2^{17}$--.
Column 12, line 59, replace "L=$2^{18}$" with --$L = 2^{18}$--.
Column 12, line 60, replace "nk-k=16, some examples of n, k" with --$nk - k$ =16, some examples of $n, k$ --.
Column 12, line 61, replace "Pat" with --$P_{al}$ --.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Columns 12, line 62 through Column 13, line 7, Table 4 should appear as:

| $k$ | $n$ | $P_{al}$ |
|---|---|---|
| 1 | 17 | $2^{-17}$ |
| 2 | 9 | $2^{-18}$ |
| 4 | 5 | $2^{-20}$ |
| 8 | 3 | $2^{-24}$ |
| 16 | 2 | $2^{-32}$ |

Column 13, line 9, replace "$L = 2^{17}$" with --$L = 2^{17}$--.
Column 13, line 11, replace "$P_{al} = 2^{-20}$" with --$P_{al} = 2^{-20}$--.
Column 13, line 13, replace "$P_{al}=2^{-32}$. If L=$2^{18}$" with --$P_{al} = 2^{-32}$. If $L = 2^{18}$--.
Column 13, line 14, replace "C, L, K" with --C, $L$, $k$--.
Column 13, line 16, replace "C, L, K" with --C, $L$, $k$--.
Column 13, line 17, replace "Eqnuation" with --Equation--.
Column 13, line 18, replace "for n" with --for $n$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 13, line 20 through 23, Formula (11) should appear as:

$$P_{al} = 2^{-nk} = 2^{-\left((k - \frac{\ln(1-\exp(\frac{\ln(1-C)}{L}))}{\ln 2})\right)}$$

Column 13, line 27, replace "the L" with --the $L$--.
Column 13, line 28, replace "the L" with --the $L$--.
Column 13, line 31, replace "the L" with --the $L$--.
Column 13, line 33, replace "L-1" with --$L$-1--.
Column 13, line 35, replace "L-1" with --$L$-1--.
Column 13, line 36, replace "to L" with --to $L$--.
Column 13, line 37, replace "l-bit" with --$l$-bit--.
Column 13, line 38 replace "to l" with --to $l$--.
Column 13, line 38, replace "L/l" with --$L/l$--.
Column 13, line 39, replace "l-bit" with --$l$-bit--.
Column 13, line 41, replace "l=$2^{20}$" with --$l = 2^{20}$--.
Column 13, line 43, replace "L=$2^{17}$" with --$L = 2^{17}$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 13, line 44, replace "L=$2^{18}$" with --$L = 2^{18}$--.
Column 13, line 45, replace "P$_{al}$ =" with --$P_{al}$ = --.
Column 13, line 46, replace "k=8, or P$_{al}$=$2^{-32}$ with k=16" with --$k$=8, or $P_{al} = 2^{-32}$ with $k$=16--.
Column 13, line 49, replace "L=$2^{18}$" with --$L=2^{18}$--.
Column 13, line 66, replace "than L" with --than $L$--.
Column 13, line 66, replace "$2^{k-k}$" with --$2^{nk-k}$--.
Column 14, line 2, replace "nk-k=16" with --$nk - k$ =16--.
Column 14, line 4, replace "k=1" with --$k$ =1--.
Column 14, line 5, replace "k=1, which yields P$_{al}$=$2^{-n}$ if n" with --$k$ =1, which yields $P_{al}=2^{-n}$ if $n$--.
Column 14, line 6, replace "1-bit" with -- $l$-bit--.
Column 14, line 7, replace "1-stage" with -- $l$-stage--.
Column 14, line 9, replace "1-stage" with -- $l$-stage--.
Column 14, line 10, replace "k=1" with --$k$ =1--.
Column 14, line 13, replace "P$_{al}$=$2^{-n}$" with --$P_{al}= 2^{-n}$--.
Column 14, line 13, replace "L=$2^n$" with --$L = 2^n$--.
Column 14, line 14, replace "L=$2^{n+1}$" with --$L = 2^{n+1}$--.
Column 14, line 15, replace "1-stage" with --$l$-stage--.
Column 14, line 16, replace "if L" with --if $L$--.
Column 14, line 17, replace "k = 1 and l = $2^{20}$" with --$k$ =1 and $l = 2^{20}$--.
Column 14, line 32, replace "n and k" with --$n$ and $k$--.
Column 14, line 33, replace "nk-k=16" with --$nk - k$ =16--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 14, lines 34 through 50, Table 5 should appear as:

TABLE 5

| CIRCUIT NAME | $\log_2$ of the number of extra output bits | | | | |
|---|---|---|---|---|---|
| | $n=17, k=1$ | $n=9, k=2$ | $n=5, k=4$ | $n=3, k=8$ | $n=2, k=16$ |
| C432 | 15.79 | 14.94 | 16.19 | 15.87 | 17.01 |
| C499 | 14.07 | 15.29 | 15.72 | 14.65 | 15.08 |
| C880 | 16.49 | 16.15 | 14.46 | 15.61 | 16.27 |
| C1355 | 14.07 | 15.29 | 15.72 | 14.65 | 15.08 |
| C1908 | 15.86 | 15.57 | 16.36 | 15.81 | 16.08 |
| C2670 | 16.95 | 15.36 | 15.64 | 16.21 | 14.06 |
| C3540 | 15.46 | 14.50 | 17.22 | 15.08 | 17.26 |
| C5315 | 14.38 | 17.21 | 16.49 | 16.68 | 15.60 |
| C6288 | 16.79 | 15.35 | 15.64 | 16.23 | 15.34 |
| C7552 | 16.98 | 16.87 | 16.67 | 16.50 | 15.72 |
| *averages:* | 15.68 | 15.65 | 16.01 | 15.73 | 15.75 |
| Average = 15.76 | | | | | |

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 14, line 51, replace "l-bit" with --$l$-bit--.
Column 14, line 52, replace "$P_{al}=2^{-17}$" with --$P_{al}=2^{-17}$--.
Column 14, line 54, replace "$P_{al}=2^{-32}$" with --$P_{al}=2^{-32}$--.
Column 14, line 60, replace "l=$2^{20}$" with --$l = 2^{20}$--.
Column 14, line 63, replace "Reduce m" with --Reduce $m$--.
Column 14, line 67, replace "1<m<n" with --$1 \leq m < n$--.
Column 15, line 3, delete "can".
Column 15, line 4, replace "m<n. In this case, n-m of the n" with --$m<n$. In this case, $n-m$ of the $n$--.
Column 15, line 9, replace "(L+l-1)-bit" with --$(L+l-1)$-bit--.
Column 15, line 9, replace "M=b$_1$, b$_2$, ..., b$_{l+L-1}$" with --$M=b_1, b_2, ..., b_{l+L-1}$--.
Column 15, line 10, replace "b$_1$" with --$b_1$--.
Column 15, line 11, replace "s$_0$" with --$s_0$--.
Column 15, line 12, replace "m and n" with --$m$ and $n$--.

UNITED STATES PATENT AND TRADEMARK OFFICE
CERTIFICATE OF CORRECTION

PATENT NO :   5,475,694
DATED      :   12 December, 1997
INVENTORS :   André Ivanov, Yuejian Wu It is certified that error appears in the above identified patent and that said Letters Patent is hereby corrected as shown below:

Column 15, lines 14 through 36, should appear as follows:

```
search.process(M, L, m, n, k, l₁, l₂, ..., lₙ)
        seed = s₀ = 0; l₀ = 0;
        for(i=1 to n) do
                initialize the signature LFSR with seed;
                j = i-1;
                calculate the signature sᵢ by shifting the
                sequence bits
                b_{lj+1}, b_{lj+2}, ..., b_{lj+li} into the LFSR;
                seed = sᵢ;
        endoffor
        i = 1;
        while((the number of identical signatures is smaller
        than n-m)&&(i ≤ L)) do
                for(j=0 to n) do
                        initialize the signature LFSR to the value
                        of sⱼ;
                        calculate a new sⱼ by shifting bit b_{i+lj} into
                        the signature LFSR;
                endoffor
                i = i + 1;
        endofwhile
        if(i > L) then print "fail to find an adequate
        sequence";
        else print the results i, and s₀, s₁, s₂, ..., sₙ;
endofsearch.
```

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 15, line 40, replace "would produced at the n" with --would be produced at the $n$--.
Column 15, line 43, replace "could could" with --could--.
Column 15, line 43, replace "wherein m" with --wherein $m$--.
Column 15, line 44, replace "exceed n" with --exceed $n$--.
In the claims, Column 16, line 11, replace "$s_i$" with --$s_i$--.
Column 16, line 16, replace "n check points $l_1$, $l_2$" with --$n$ check points $l_1$, $l_2$--.
Column 16, line 17, replace "$l_n$, where n>1" with --$l_n$, where $n>1$--.
Column 16, line 18, replace "m reference vectors, $r_1$, $r_2$, ..., $r_m$" with --$m$ reference vectors, $r_1$, $r_2$, ..., $r_m$--.
Column 16, line 19, replace "m >1, said set of m" with --$m \geq 1$, said set of $m$--.
Column 16, line 21, replace "$l_1$, $l_2$, ..., $l_n$" with --$l_1$, $l_2$, ..., $l_n$--.
Column 16, line 28, replace "$l_i$, where 1≤i≤n" with --$l_i$, where $1 \leq i \leq n$--.
Column 16, line 29, replace "of n" with --of $n$--.
Column 16, line 30, replace "$s_i$" with --$s_i$--.
Column 16, line 33, replace "$l_i$" with --$l_i$--.
Column 16, line 34, replace "$s_i$" with --$s_i$--.
Column 16, line 35, replace "of m" with --of $m$--.
Column 16, line 38, replace "m reference" with --$m$ reference--.
Column 16, line 41, replace "$s_i$" with --$s_i$--.
Column 16, line 42, replace "m reference" with --$m$ reference--
Column 16, line 44, replace "$s_i$" with --$s_i$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

In the claims:
Column 16, line 47, replace "s$_i$" with --$s_i$--.
Column 16, line 48, replace "l$_i$" with --$l_i$--.
Column 16, line 51, replace "m=n" with --$m = n$--.
Column 16, line 52, replace "m>n" with --$m > n$--.
Column 16, line 53, replace "1<m<n" with --$1 < m < n$--.
Column 16, line 54, replace "m=1 and n" with --$m=1$ and $n$--.
Column 16, line 59, replace "n check points l$_1$, l$_2$, ..., l$_n$" with --$n$ check points $l_1, l_2, ..., l_n$--.
Column 16, line 60, replace "n>1" with --$n > 1$--.
Column 16, line 61, replace "m references r$_1$, r$_2$, ..., r$_m$" with --$m$ references $r_1, r_2, ..., r_m$--.
Column 16, line 62, replace "m>1, said set of m" with --$m \geq 1$, said set of $m$--.
Column 16, line 64, replace "n check points l$_1$, l$_2$, ..., l$_n$" with --$n$ check points $l_1, l_2, ..., l_n$--.
Column 17, line 1, replace "l$_i$, where 1≤i≤n" with --$l_i$, where $1 \leq i \leq n$--.
Column 17, line 2, replace "of n" with --of $n$--.
Column 17, line 3, replace "s$_i$" with --$s_i$--.
Column 17, line 4, replace "l$_i$" with --$l_i$--.
Column 17, line 5, replace "s$_i$" with --$s_i$--.
Column 17, line 6, replace "of m" with --of $m$--.
Column 17, line 9, replace "of m" with --of $m$--.
Column 17, line 11, replace "s$_i$" with --$s_i$--.
Column 17, line 12, replace "m references" with --$m$ references--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 17, line 13, replace "m=n" with --$m = n$--.
Column 17, line 14, replace "m>n" with --$m > n$--.
Column 17, line 15, replace "1<m<n" with --$1 < m < n$--.
Column 17, line 16, replace "m=1 and n" with --$m = 1$ and $n$--.
Column 17, line 24, replace "of n" with --of $n$--.
Column 17, line 25, replace "n sub-sequences" with -- $n$ sub-sequences--.
Column 17, line 25, replace "of n sub-" with --of $n$ sub---.
Column 17, line 26, replace "$l_1, l_2, ..., l_n$" with --$l_1, l_2, ..., l_n$--.
Column 17, line 27, replace "m references $r_1, r_2, ..., r_m$" with --$m$ references $r_1, r_2, ..., r_m$--.
Column 17, line 29, replace "n check points $l_1$" with --$n$ check points $l_1$--.
Column 17, line 30, replace "$l_2, ..., l_n$" with --$l_2, ..., l_n$--.
Column 18, line 3, replace "$l_i$" with --$l_i$--.
Column 18, line 4, replace "1≤i≤n" with --$1 \le i \le n$--.
Column 18, line 5, replace "$s_i$" with --$s_i$--.
Column 18, line 6, replace "$l_i$" with --$l_i$--.
Column 18, line 7, replace "$s_i$" with --$s_i$--.
Column 18, line 8, replace "m references" with --$m$ references--.
Column 18, line 9, replace "$s_i$" with --$s_i$--.
Column 18, line 10, replace "of m" with --of $m$--.
Column 18, line 13, replace "of n" with --of $n$--.
Column 18, line 14, replace "$s_i$" with --$s_i$--.
Column 18, line 14, replace "of m" with --of $m$--.

UNITED STATES PATENT AND TRADEMARK OFFICE
CERTIFICATE OF CORRECTION

PATENT NO : 5,475,694
DATED : 12 December, 1997
INVENTORS : André Ivanov, Yuejian Wu It is certified that error appears in the above identified patent and that said Letters Patent is hereby corrected as shown below:

Column 18, line 17, replace "of n" with --of $n$--.
Column 18, line 18, replace "$s_i$" with --$s_i$--.
Column 18, line 18, replace "of m" with --of $m$--.
Column 18, line 20, replace "m=n" with --$m = n$--.
Column 18, line 21, replace "m>n" with --$m > n$--.
Column 18, line 22, replace "1<m<n" with --$1 < m < n$--.
Column 18, line 23, replace "m=1 and n" with --$m = 1$ and $n$--.

Signed and Sealed this

Twentieth Day of February, 2001

Attest:

NICHOLAS P. GODICI

Attesting Officer

Acting Director of the United States Patent and Trademark Office